(12) United States Patent
Englhardt et al.

(10) Patent No.: US 9,147,592 B2
(45) Date of Patent: Sep. 29, 2015

(54) LINKED VACUUM PROCESSING TOOLS AND METHODS OF USING THE SAME

(71) Applicant: Applied Materials, Inc., Santa Clara, CA (US)

(72) Inventors: Eric A. Englhardt, Palo Alto, CA (US);
Steve Szudarski, Fremont, CA (US);
Andrew Scott Cornelius, San Jose, CA (US); Amitabh Puri, San Jose, CA (US); Michael Robert Rice, Pleasanton, CA (US); Jeffrey C. Hudgens, San Francisco, CA (US); Steven V. Sansoni, Livermore, CA (US); Robert Irwin Decottignies, Redwood City, CA (US); Dean C. Hruzek, Cedar Park, TX (US); Peter Irwin, Austin, TX (US); Nir Merry, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 125 days.

(21) Appl. No.: 13/961,538

(22) Filed: Aug. 7, 2013

(65) Prior Publication Data
US 2014/0044503 A1 Feb. 13, 2014

Related U.S. Application Data

(60) Provisional application No. 61/681,062, filed on Aug. 8, 2012, provisional application No. 61/723,775, filed on Nov. 7, 2012.

(51) Int. Cl.
*H01L 21/67* (2006.01)
*H01L 21/677* (2006.01)

(52) U.S. Cl.
CPC .... *H01L 21/67739* (2013.01); *H01L 21/67161* (2013.01); *H01L 21/67184* (2013.01)

(58) Field of Classification Search
CPC ................ H01L 21/67739; H01L 21/67161; H01L 21/67184
See application file for complete search history.

(56) References Cited

U.S. PATENT DOCUMENTS 5,186,718 A * 2/1993 Tepman et al. ............. 29/25.01
5,820,679 A * 10/1998 Yokoyama et al. ........... 118/719
(Continued)

FOREIGN PATENT DOCUMENTS

JP 2009-094530 4/2009
KR 10-2011-0104420 9/2011

OTHER PUBLICATIONS

International Search Report and Written Opinion of International Patent Application No. PCT/US2013/054001 mailed Nov. 25, 2013.
(Continued)

*Primary Examiner* — Kaitlin Joerger
(74) *Attorney, Agent, or Firm* — Dugan & Dugan, PC

(57) ABSTRACT

In some embodiments, a linked processing tool system is provided that includes (1) a first processing tool having at least a first transfer chamber configured to couple to a plurality of processing chambers; (2) a second processing tool having at least a second transfer chamber configured to couple to a plurality of processing chambers; (3) a third transfer chamber coupled between the first and second processing tools and configured to transfer substrates between the first and second processing tools; and (4) a single sequencer that controls substrate transfer operations between the first processing tool, the second processing tool and the third transfer chamber of the linked processing tool system. Numerous other aspects are provided.

20 Claims, 19 Drawing Sheets

(56) References Cited

U.S. PATENT DOCUMENTS

| | | | |
|---|---|---|---|
| 5,882,165 A | | 3/1999 | Maydan et al. |
| 6,395,094 B1* | | 5/2002 | Tanaka et al. ............. 118/719 |
| 2003/0131458 A1* | | 7/2003 | Wang et al. ............. 29/25.01 |
| 2004/0040504 A1* | | 3/2004 | Yamazaki et al. ............. 118/715 |
| 2004/0206307 A1* | | 10/2004 | Boroson et al. ............. 118/719 |
| 2005/0111938 A1* | | 5/2005 | van der Meulen ............. 414/217 |
| 2007/0264106 A1* | | 11/2007 | van der Meulen ............. 414/217 |
| 2007/0269297 A1* | | 11/2007 | Meulen et al. ............. 414/222.01 |
| 2008/0219812 A1* | | 9/2008 | van der Meulen et al. ... 414/217 |
| 2008/0232947 A1 | | 9/2008 | Van Der Meulen et al. |
| 2013/0142595 A1* | | 6/2013 | Shimomura et al. ............. 414/217 |
| 2013/0202387 A1* | | 8/2013 | Hiroki ............. 414/217 |
| 2013/0309045 A1* | | 11/2013 | Kobayashi ............. 414/217 |
| 2014/0060735 A1* | | 3/2014 | Rosenblum ............. 156/345.1 |
| 2014/0086720 A1* | | 3/2014 | Kao et al. ............. 414/805 |
| 2014/0099176 A1* | | 4/2014 | Nogi et al. ............. 414/217 |
| 2014/0140792 A1* | | 5/2014 | Kao et al. ............. 414/217 |
| 2014/0154887 A1* | | 6/2014 | Trivedi et al. ............. 438/703 |
| 2014/0242804 A1* | | 8/2014 | Ku et al. ............. 438/745 |

OTHER PUBLICATIONS

Trivedi et al., U.S. Appl. No. 14/093,503 (20290), titled: Semiconductor Device Processing Tools and Methods for Patterning Substrates, filed Dec. 1, 2013.

International Preliminary Report on Patentability of International Patent Application No. PCT/US2013/054001 mailed Feb. 19, 2015.

* cited by examiner

LINKED VACUUM PROCESSING TOOLS AND METHODS OF USING THE SAME

The present application claims priority to U.S. Provisional Patent Application Nos. 61/681,062, filed Aug. 8, 2012, and 61/723,775, filed Nov. 7, 2012, which are hereby incorporated by reference herein in their entirety for all purposes.

FIELD

The present application relates to semiconductor device manufacturing, and more specifically to vacuum processing tools and methods of using the same.

BACKGROUND

Manufacturing of semiconductor devices typically involves performing a sequence of procedures with respect to a substrate or "wafer" such as a silicon substrate, a glass plate, etc. These steps may include polishing, deposition, etching, photolithography, heat treatment, and so forth. Usually a number of different processing steps may be performed in a single processing system or "tool" which includes a plurality of processing chambers. However, it is generally the case that other processes are performed at other processing locations within a fabrication facility, and it is accordingly necessary that substrates be transported within the fabrication facility from one processing location to another. Depending on the type of semiconductor device to be manufactured, there may be a relatively large number of processing steps employed, to be performed at many different processing locations within the fabrication facility.

It is conventional to transport substrates from one processing location to another within substrate carriers such as sealed pods, cassettes, containers and so forth. It is also conventional to employ automated substrate carrier transport devices, such as automatic guided vehicles, overhead transport systems, substrate carrier handling robots, etc., to move substrate carriers from location to location within the fabrication facility or to transfer substrate carriers from or to a substrate carrier transport device.

Such transport of substrates typically involves exposing the substrates to room air, or at least to non-vacuum conditions. Either may expose the substrates to an undesirable environment (e.g., oxidizing species) and/or contaminants.

SUMMARY

In some embodiments, a linked processing tool system is provided that includes (1) a first processing tool having at least a first transfer chamber configured to couple to a plurality of processing chambers; (2) a second processing tool having at least a second transfer chamber configured to couple to a plurality of processing chambers; (3) a third transfer chamber coupled between the first and second processing tools and configured to transfer substrates between the first and second processing tools; and (4) a single sequencer that controls substrate transfer operations between the first processing tool, the second processing tool and the third transfer chamber of the linked processing tool system.

In some embodiments, a linked processing tool system is provided that includes (1) a first processing tool having at least a first transfer chamber configured to couple to a plurality of processing chambers; (2) a second processing tool having at least a second transfer chamber configured to couple to a plurality of processing chambers; and (3) a buffer chamber that couples to at least one of the first and second processing tools and a factory interface, the buffer chamber configured to retrieve substrates from the factory interface and transfer the substrates to at least one of the first and second processing tools. The first and second processing tools and the buffer chamber are configured so that substrates transferred from the buffer chamber are isolated from the buffer chamber and transferred between and processed within processing chambers of the first processing tool and processing chambers of the second processing tool while under vacuum.

In some embodiments, a linked processing tool system is provided that includes (1) a first processing tool having a first transfer chamber and a second transfer chamber each configured to couple to a plurality of processing chambers; (2) a second processing tool having a third transfer chamber and a fourth transfer chamber each configured to couple to a plurality of processing chambers; (3) a third processing tool having a fifth transfer chamber and a sixth transfer chamber each configured to couple to a plurality of processing chambers; (4) a first via coupling the second transfer chamber of the first processing tool to the third transfer chamber of the second processing tool; (5) a second via coupling the second transfer chamber of the first processing tool to the fourth transfer chamber of the second processing tool; (6) a third via coupling the fifth transfer chamber of the third processing tool to the third transfer chamber of the second processing tool; and (7) a fourth via coupling the fifth transfer chamber of the third processing tool to the fourth transfer chamber of the second processing tool. The third transfer chamber of the second processing tool serves as a buffer chamber configured to retrieve substrates from a factory interface and transfer the substrates to the second transfer chamber of the first processing tool. The first, second and third processing tools are configured so that substrates transferred from the third transfer chamber into the second transfer chamber are isolated from the third transfer chamber and transferred between and processed within processing chambers coupled to the first transfer chamber, second transfer chamber, fourth transfer chamber, fifth transfer chamber and sixth transfer chamber while under vacuum and isolated from the third transfer chamber. Numerous other embodiments are provided in accordance with these and other aspects of the invention.

Other features and aspects of the present invention will become more fully apparent from the following detailed description, the appended claims and the accompanying drawings.

DETAILED DESCRIPTION

Figure 1A:
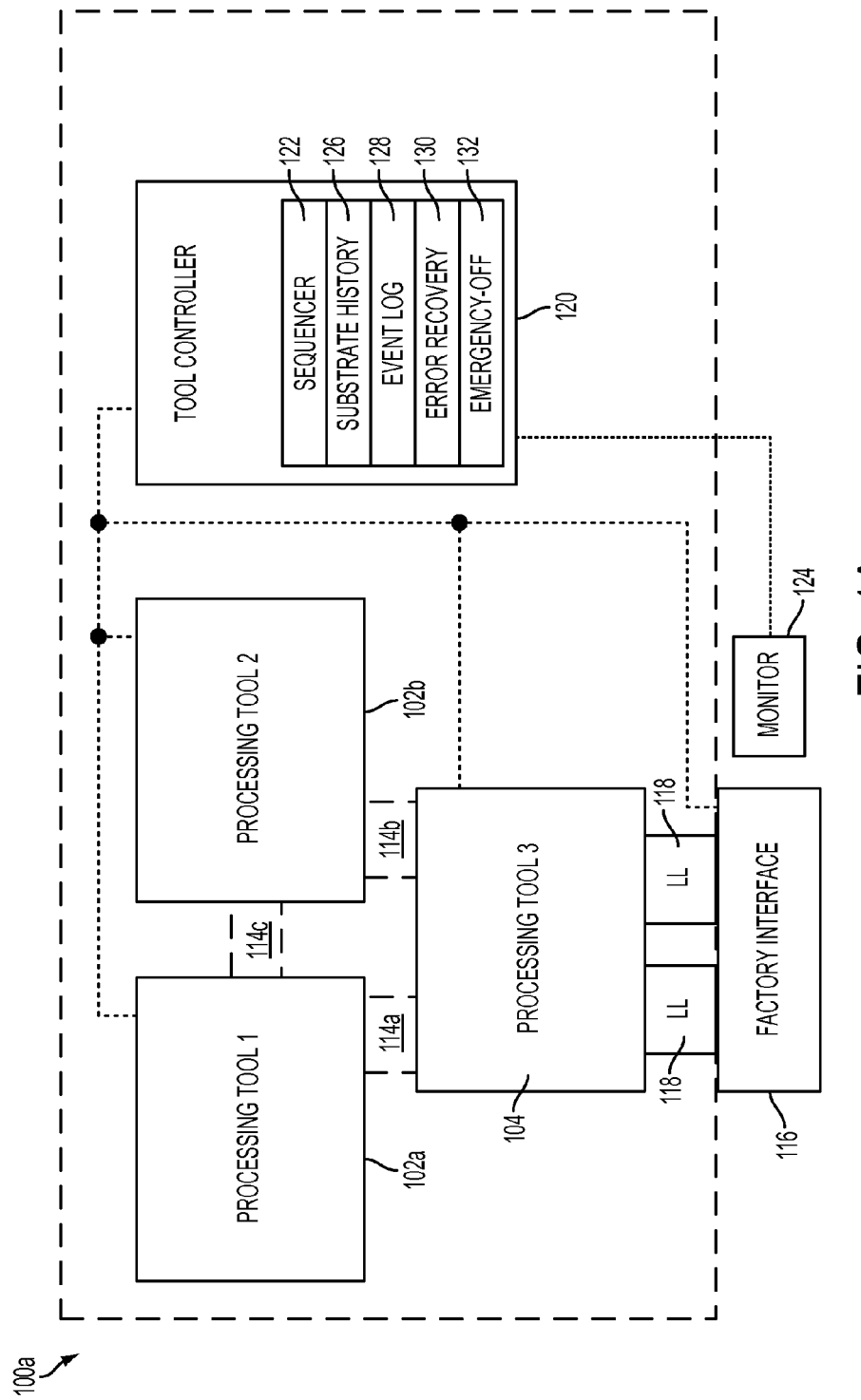
FIG. 1A illustrates an example linked processing tool (LPT) system that includes a first processing tool linked to a second processing tool with a third processing tool in accordance with embodiments of the present invention.

In accordance with embodiments of the present invention, one or more processing tools may be coupled together or "linked" to form a linked processing tool (LPT) system. As will be described further below, use of an LPT system allows substrates to be transported under vacuum to the various chamber locations of each processing tool within the LPT system, and may significantly increase the number of high vacuum or "clean" chamber locations (e.g., facets) available on a mainframe. (Such processing tools would typically be used as separate, stand-alone processing tools that operate independently of one another).

In some embodiments, an LPT system may be viewed as a single tool, at least to an operator and/or factory software, and employ one sequencer, one monitor, one substrate history, and/or one connection to a factory. For example, single software and/or a single user interface may be employed for the LPT system, allowing (1) all data and screens to be viewed through the same monitor; (2) use of a single sequencer, substrate history, event log, error recovery, etc.; and/or (3) use of a single connection to the factory host. Such an embodiment may provide a user with an experience similar to that observed when employing a single tool, providing unified error recovery, and no special procedures for transferring substrates from one tool to the next within the LPT system. Substrate return to carrier may be performed in the same manner as is employed for an individual processing tool. Likewise, a single sequencer may be used to optimize throughput and provide conditioning of chambers under any and/or all conditions (e.g., lot start, end, number of substrates, etc.). Unified single substrate history and events, and/or a single-wire factory automation (FA) connection may be employed.

In other embodiments, each processing tool within an LPT system may be viewed as a separate tool and/or each tool may employ a separate sequencer, monitor, substrate history and/or connection to a factory. For example, each tool with the LPT system may be treated as a separate tool by the factory and/or flow of materials may be managed by a user's FA host software. In some embodiments, a software interface and/or software code may be provided for controlling substrate delivery to an LPT system's front end, taking into account the number of processing tools and/or chambers available within the LPT system.

In either embodiment, the LPT system may be Semi S2/S8 compliant (e.g., employ a single emergency-off (EMO) system).

In some embodiments, and as described below, the vacuum level in the buffer chambers of linked processing tools may be increased and/or maximized to reduce and/or minimize process risks. In some embodiments, transfer chamber vacuum levels of greater than about $10^{-6}$ Torr may be employed. Further, in some embodiments, all existing chambers of each processing tool may be integrated (e.g., accessible under vacuum conditions) within a linked processing tool system.

In a single tool embodiment, software may be provided to control and/or present all components of the LPT system as a unified tool to the operator and FA host. For example, a similar user experience may be provided relative to the processing tools within the LPT system, with little new training and/or updated operating procedures. As mentioned, unified substrate history and/or events may be employed (e.g., substrate flow through all processing chambers within the LPT system may be stored in a single substrate history database). Further, a unified sequencer may be employed to control flow of substrates through all chambers and/or manage re-orientation of substrates (if needed), and/or to perform any other suitable functions for improving and/or optimizing throughput. For example, a unified sequencer may be employed to manage conditioning and/or pasting of chambers based on existing conditioning triggers (e.g., lot start/end, number of substrates, or the like). Sequencer architecture may include "children" sequencers for the processing tools within the LPT system, with an interface defined for the children sequencers.

FIG. 1A illustrates an example LPT system 100a that includes a first processing tool 102a linked to a second processing tool 102b with a third processing tool 104. Fewer or more processing tools may be linked, and/or other linking configurations may be employed as described further below. Vias 114a, 114b and/or 114c allow substrates to be transported between processing tools 102a, 102b and 104. Substrates may be supplied to the LPT system 100a at a factory interface 116 and supplied to processing tool 104 through one or more load locks 118. Additional factory interfaces and/or load locks may be employed.

The LPT system 100a of FIG. 1A may be viewed as a single tool, at least to an operator and/or factory software, and employ single tool controller 120, one sequencer 122, one monitor 124, one substrate history 126, and/or one connection to a factory. For example, single software and/or a single user interface may be employed for the LPT system 100a, allowing (1) all data and screens to be viewed through the same monitor 124; (2) use of a single sequencer 122, substrate history 126, event log 128, error recovery 130, etc.; and/or (3) use of a single connection to the factory host. As mentioned, such an embodiment may provide a user with an experience similar to that observed when employing a single tool, providing unified error recovery, and no special procedures for transferring substrates from one tool to the next within the LPT system 100a. Substrate return to carrier may be performed in the same manner as is employed for an individual processing tool. Single sequencer 122 may be used to optimize throughput and provide conditioning of chambers under any and/or all conditions (e.g., lot start, end, number of substrates, etc.). Unified single substrate history and events, and/or a single-wire factory automation (FA) connection may be employed.

Tool controller 120 may include one or more appropriately programmed microprocessors, microcontrollers, programmable logic controllers, dedicated hardware and/or software or the like. Sequencer 122, substrate history 126, event log 128, error recovery 130 and/or emergency-off system 132 may be part of, separate from and/or remote from tool controller 120.

Figure 1B:
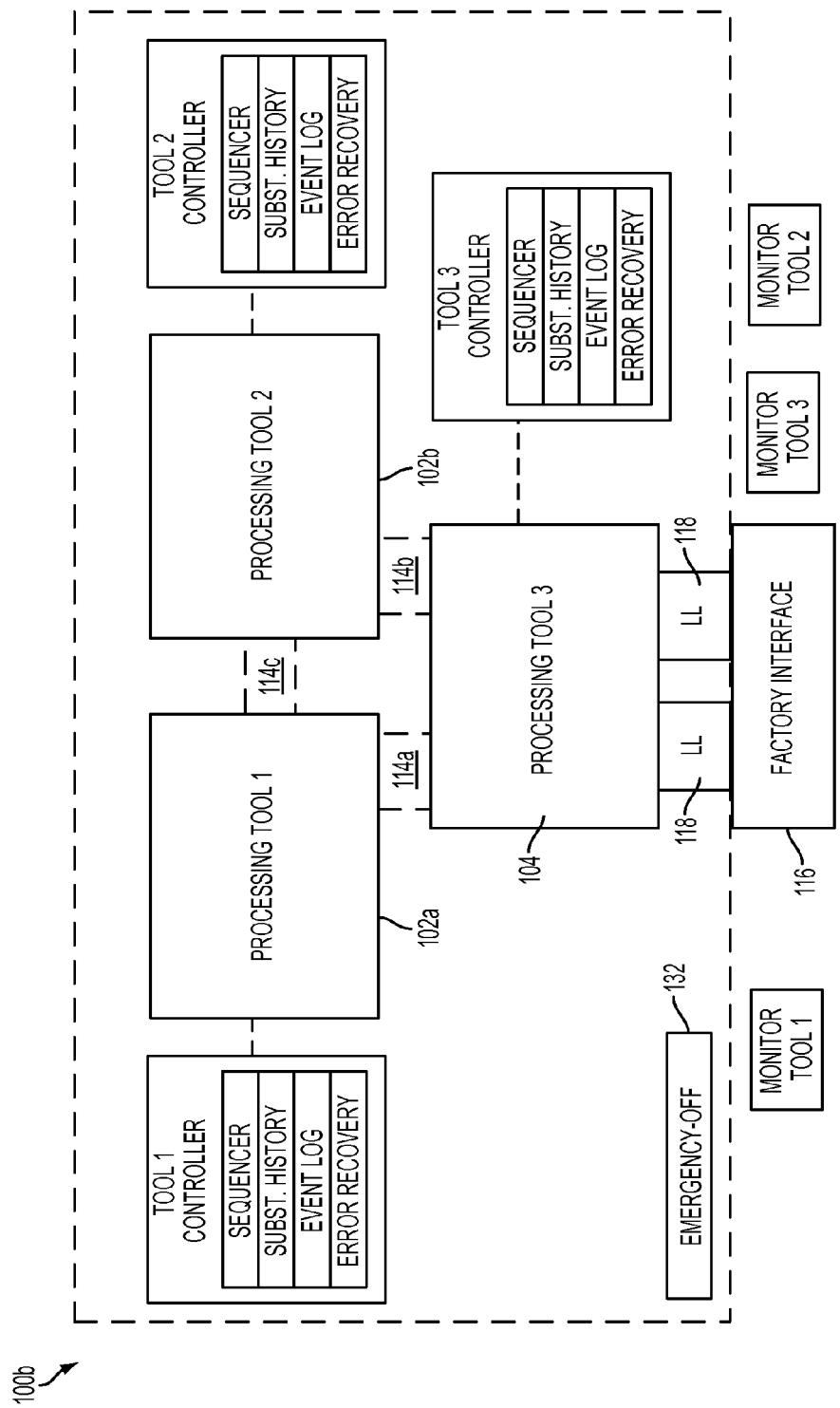
FIG. 1B illustrates an alternative embodiment of the LPT system of FIG. 1A in accordance with embodiments of the present invention.

FIG. 1B illustrates an alternative embodiment of the LPT system, referred to as LPT system 100b, in which each processing tool 102a, 102b and 104 within the LPT system may be viewed as a separate tool and/or each tool may employ a separate sequencer, monitor, substrate history and/or connection to a factory. For example, each tool within the LPT system 100b may be treated as a separate tool by the factory and/or flow of materials may be managed by a user's FA host software. In some embodiments, a software interface and/or software code may be provided for controlling substrate delivery to an LPT system 100b's front end, taking into account the number of processing tools and/or chambers available within the LPT system 100b. In either embodiment, the LPT system may be Semi S2/S8 compliant (e.g., employ a single emergency-off (EMO) system 132).

Additional example embodiments of LPT sets are described below with reference to FIGS. 1C-16. The LPT sets are shown employing the Endura 2 mainframe available from Applied Materials, Inc. of Santa Clara, Calif. In some embodiments, the Charger transfer chamber and/or the Centura ACP mainframe, also available from Applied Materials, Inc., may be employed within LPT sets. Other suitable mainframes and/or transfer chambers may be used.

Figure 1C:
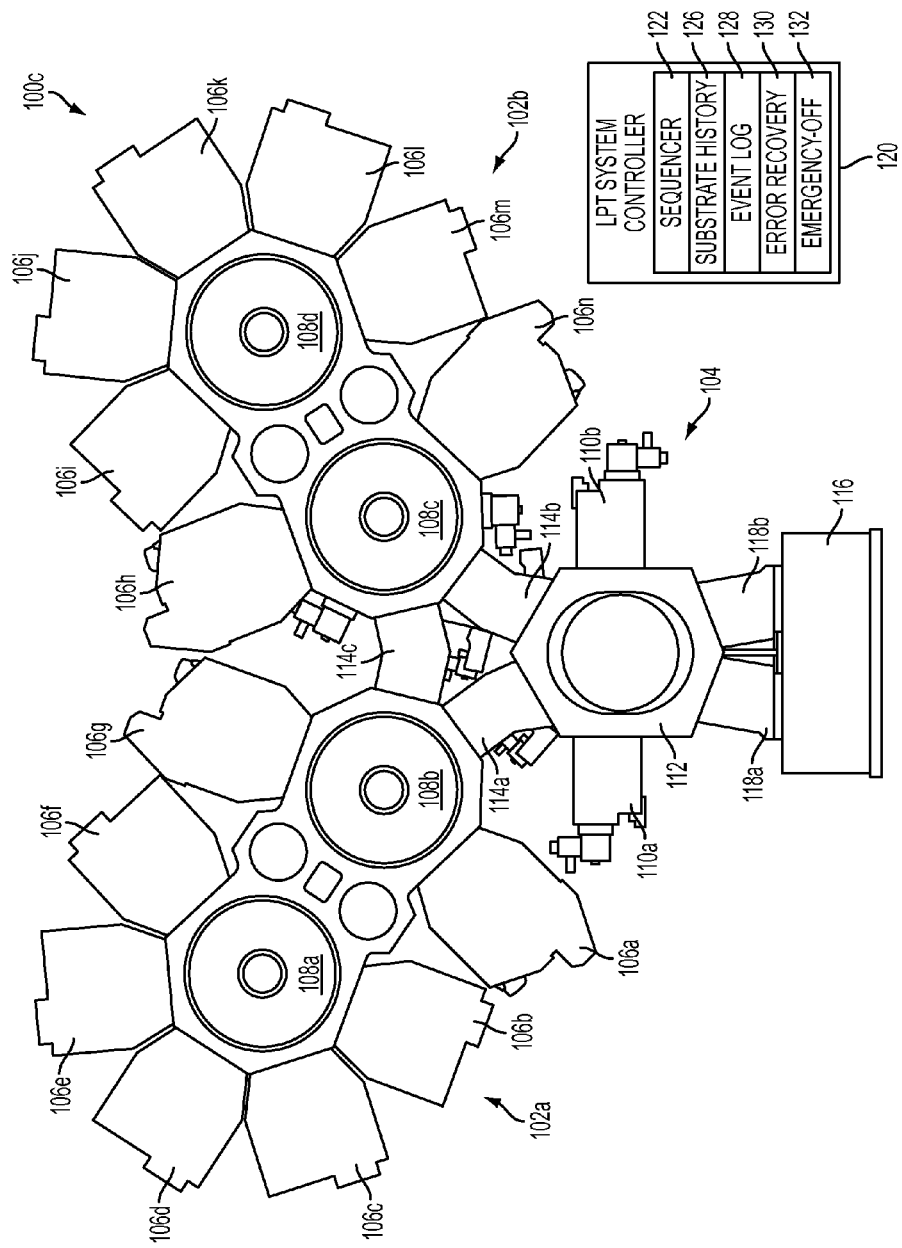
FIG. 1C is a top schematic view of an alternative embodiment of an LPT system provided in accordance with embodiments of the present invention.

With reference to the figures, FIG. 1C is a top schematic view of an LPT system 100c (hereinafter "LPT 100c") provided in accordance with embodiments of the present invention. The LPT 100c includes a first processing tool 102a coupled to a second processing tool 102b via a buffer tool 104. For example, the first and second processing tools 102a, 102b may be Endura 2's and the buffer tool 104 may be a Centura ACP, available from Applied Materials, Inc. of Santa Clara, CA. Other types and/or numbers of processing tools and/or buffer chambers may be used.

Processing tool 102a includes processing chambers 106a-g coupled to transfer chambers 108a and 108b, and processing tool 102b includes processing chambers 106h-n coupled to transfer chambers 108c and 108d. Buffer tool 104 includes degas and/or preclean chambers 110a-b coupled to transfer chamber 112, and is coupled to processing tool 102a with via 114a and to processing tool 102b with via 114b.

Processing tools 102a and 102b are coupled with via 114c. A factory interface 116 provides substrates to the buffer tool 104 via load locks 118a, 118b.

Processing chambers 106a-n may be any type of processing chambers such as deposition chambers (e.g., physical vapor deposition, chemical vapor deposition, plasma enhanced chemical vapor deposition, etc.), etch chambers, degas chambers and/or any other type of processing chambers. Any number of processing chambers 106a-n may perform the same or different processes.

As will be described further below, because of the buffering provided by buffer tool 104, each of the transfer chambers 108a-108d may be operated as a clean, high vacuum transfer chamber. The LPT 100c thus provides four clean, high vacuum transfer chambers 108a-108d, as opposed to two clean, high vacuum transfer chambers as would be present if the processing tools 102a and 102b were employed as stand-alone processing tools. Further, substrates may be transferred between the four transfer chambers 108a-108d without breaking vacuum and/or while maintaining a similar high vacuum level. Additional and/or alternative vacuum pumps, such as cryopumps, turbopumps or the like, may be employed with transfer chambers 108b and/or 108c if desired. Other LPT system configurations may provide larger numbers of clean, linked high vacuum transfer chambers as will be described further below.

In operation, substrates are delivered to the LPT 100c at the factory interface 116. For example, a substrate carrier housing a plurality of substrates may be delivered to the factory interface 116. At the factory interface 116, the substrate carrier is opened and substrates are transferred into the LPT 100c for processing. As an example, a substrate may be transferred from the factory interface 116 into first load lock 118a of buffer tool 104. Within buffer tool 104, the substrate may be degassed and/or precleaned employing one or both of degas/preclean chambers 110a, 110b. Following degas/preclean, the substrate may be transferred through via 114a to transfer chamber 108b of processing tool 102a, for processing within processing chamber 106a, for example. Following processing within processing chamber 106a, the substrate may be transferred to transfer chamber 108a and processed within one or more of processing chambers 106b-f. The substrate then may be transferred back to transfer chamber 108b, processed in processing chamber 106g (if desired), and transferred to transfer chamber 108c of processing tool 102b through via 114c. In some embodiments, via 114c may include a notch finder, a substrate aligner and/or re-orienter, etc., that may determine and/or adjust the alignment/orientation of the substrate as it passes between processing tools 102a and 102b. For example, substrates may be pre-aligned within the factory interface 116 prior to entering buffer tool 104. The alignment may be suitable for processing within the various processing chambers of processing tool 102a, but not suitable for processing within the various processing chambers of processing tool 102b due to the position/orientation of the processing chambers 106h-106n. In such cases, substrates may be "re-clocked" or re-aligned prior to entry into processing tool 102b within the via 114c.

Within processing tool 102b, the substrate may be similarly processed within one or more of processing chamber 106h-106n, and returned to buffer tool 104 through via 114b. The substrate then may be transferred back to the factory interface 116 and/or a substrate carrier. Note that substrates may travel through the LPT 100c in other directions and/or paths, and be processed within any number of the processing chambers 106a-n in any order.

In some embodiments, the LPT system 100c may be viewed as a single tool, at least to an operator and/or factory software, and employ single tool controller 120, one sequencer 122, one monitor 124, one substrate history 126, and/or one connection to a factory. In other embodiments, each processing tool within LPT system 100c may be viewed as a separate tool and/or each tool may employ a separate sequencer, monitor, substrate history and/or connection to a factory.

Figure 2:
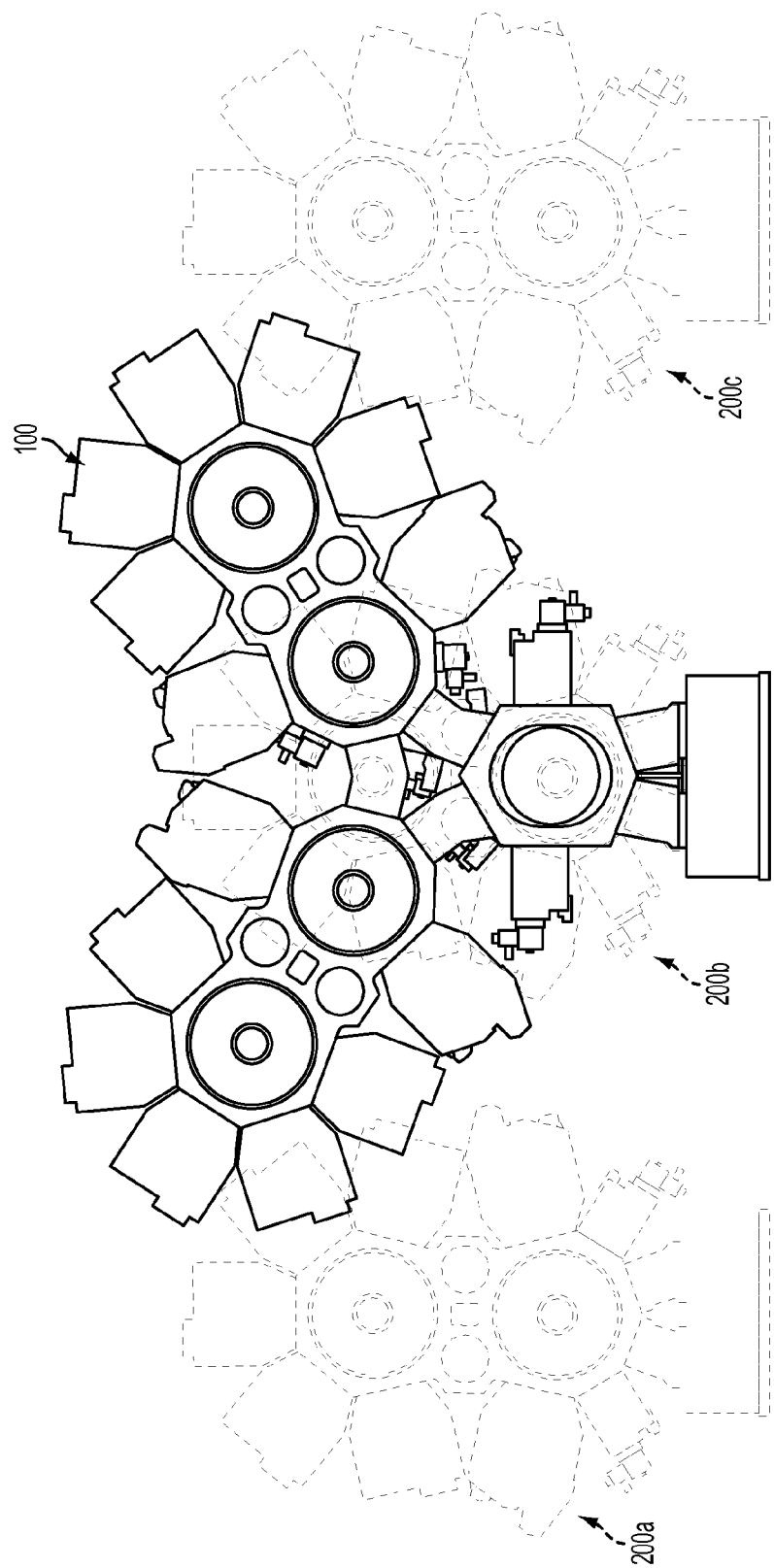
FIG. 2 is a top schematic diagram illustrating the footprint of the LPT of FIG. 1C in comparison to a typical factory layout of three stand-alone processing tools in accordance with embodiments of the present invention.
Figure 3:
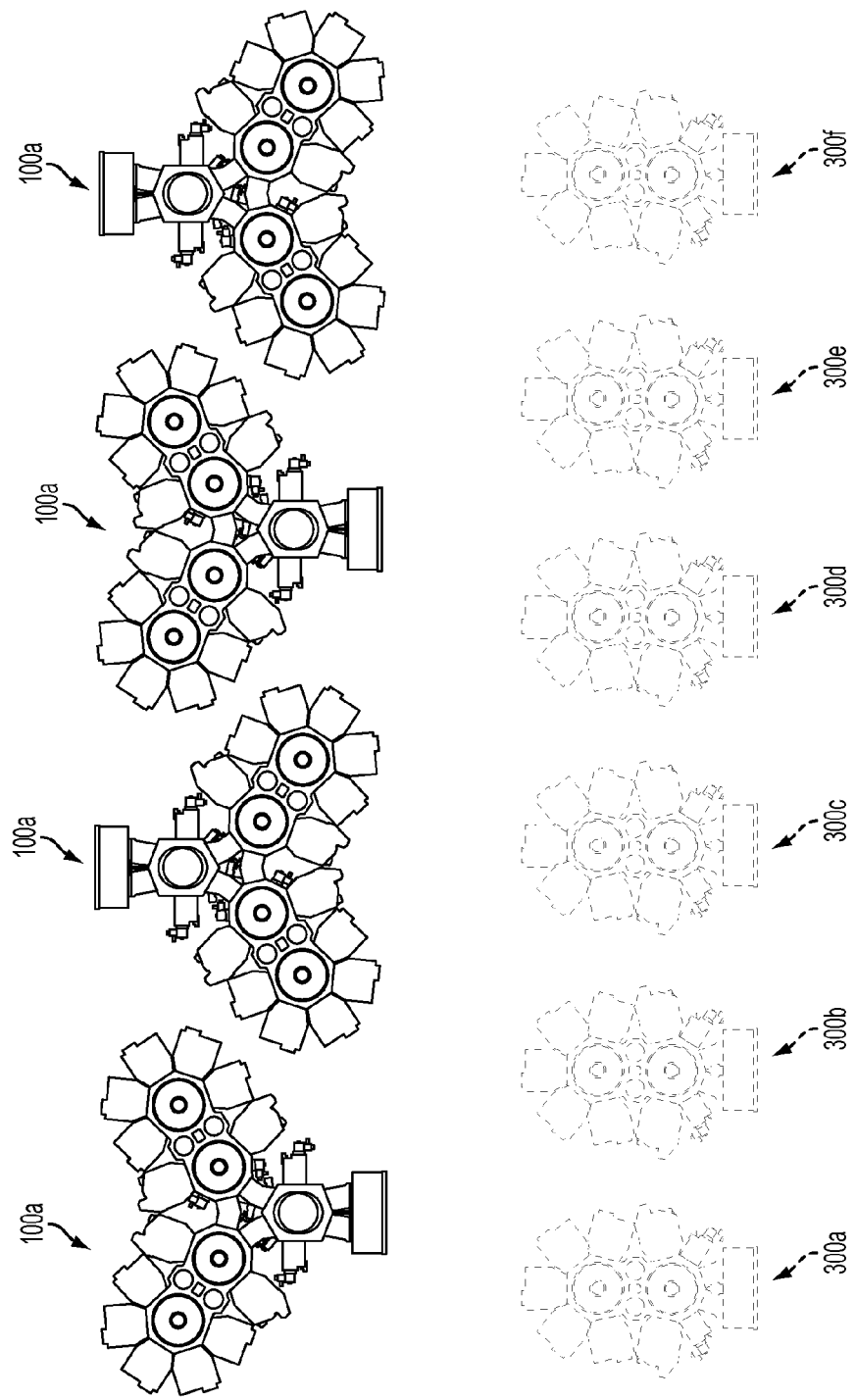
FIG. 3 is a top schematic diagram of an example layout of four LPTs of FIG. 1C in comparison to an example layout of stand-alone processing tools in accordance with embodiments of the present invention.

FIG. 2 is a top schematic diagram illustrating the footprint of the LPT 100c of FIG. 1C in comparison to a typical factory layout of three stand-alone processing tools 200a-c. The LPT 100c provides four clean, "linked" high vacuum transfer chambers (with 14 facets) in comparison to three clean, "unlinked" high vacuum transfer chambers. FIG. 3 is a top schematic diagram of an example layout of four LPTs 100a in comparison to an example layout of stand-alone processing tools 300a-f.

Figure 4A:
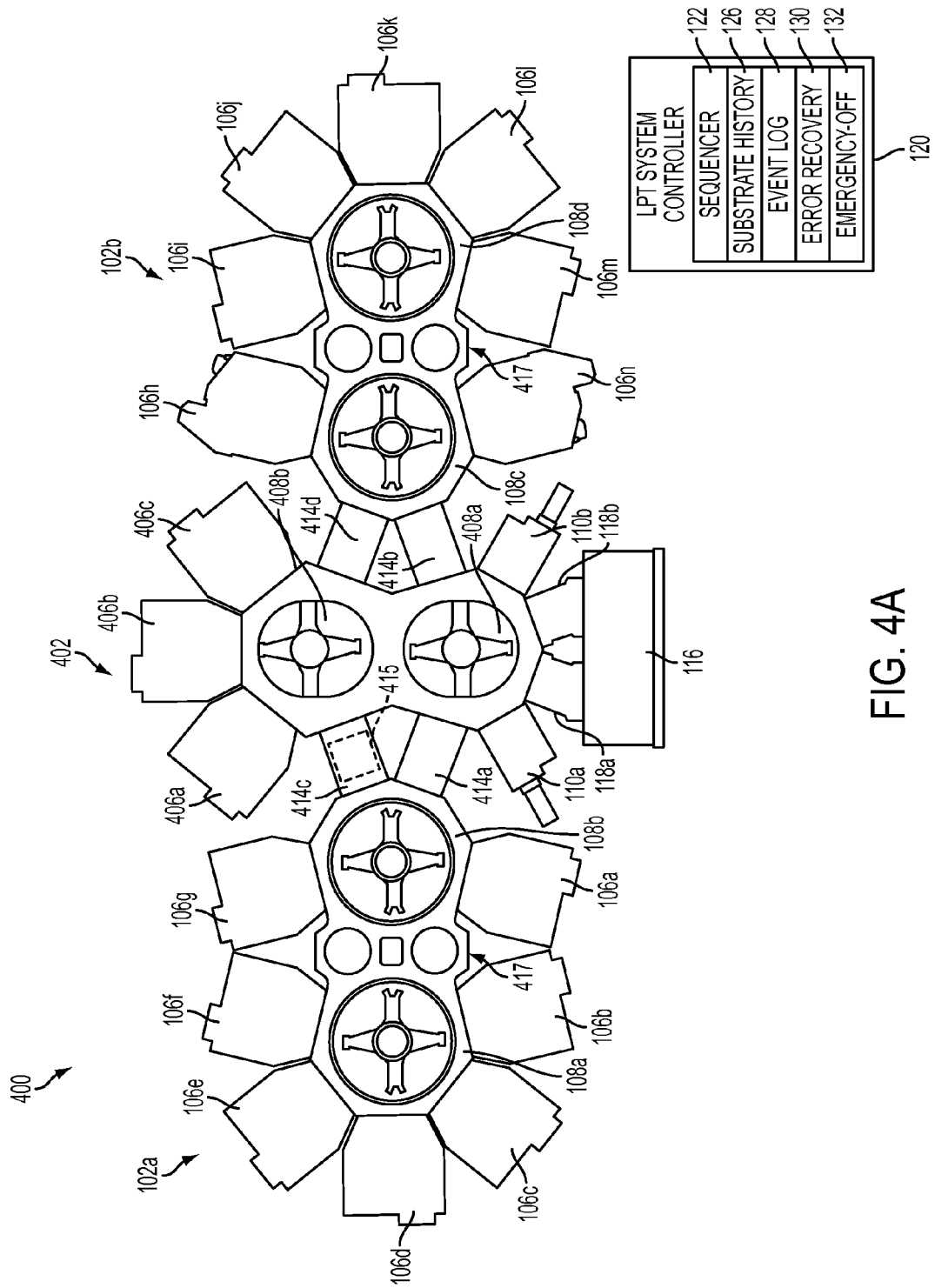
FIG. 4A is a top schematic diagram of another alternative LPT provided in accordance with the present invention.

FIG. 4A is a top schematic diagram of a first alternative LPT 400 provided in accordance with the present invention. The LPT 400 of FIG. 4A is similar to the LPT 100c of FIG. 1C, with the buffer tool 104 replaced by a dual-transfer-chamber processing tool 402 similar to processing tools 102a, 102b. For example, the processing tool 402 may be an Endura 2 system available from Applied Materials, Inc., or another suitable processing tool.

The processing tool 402 includes processing chambers 406a-c, and first and second transfer chambers 408a-b. The first transfer chamber 408a serves as a buffer chamber for LPT 400 and provides for substrate transfer to/from processing tool 102a through via 414a, and to/from processing tool 102b through via 414b. Transfer chamber 408b of processing tool 402 serves as an additional clean, high vacuum transfer chamber for LPT 400 and provides three additional processing chambers 406a-c in comparison to LPT 100c of FIG. 1C. LPT 400 of FIG. 4A therefore has a total of five clean, linked high vacuum transfer chambers coupling seventeen processing chambers. A substrate may be transferred from factory interface 116, through transfer (buffer) chamber 408a, to one or more of the processing chambers 106a-n and 406a-c for processing. Thereafter, the substrate may be returned to factory interface 116 through transfer (buffer) chamber 408a. In some embodiments, via 414c and/or via 414d may include a notch finder, a substrate aligner and/or re-orienter, etc., 415 that may determine and/or adjust the alignment/orientation of a substrate as it passes between processing tools 102a, 102b and/or 402. In some embodiments, because substrates are not passed between transfer chambers 408a and 408b, pass throughs are not provided between transfer chambers 408a and 408b (as shown). Pass through chambers 417 are provided between transfer chambers 108a and 108b, and between transfer chambers 108c and 108d.

Figure 4B:
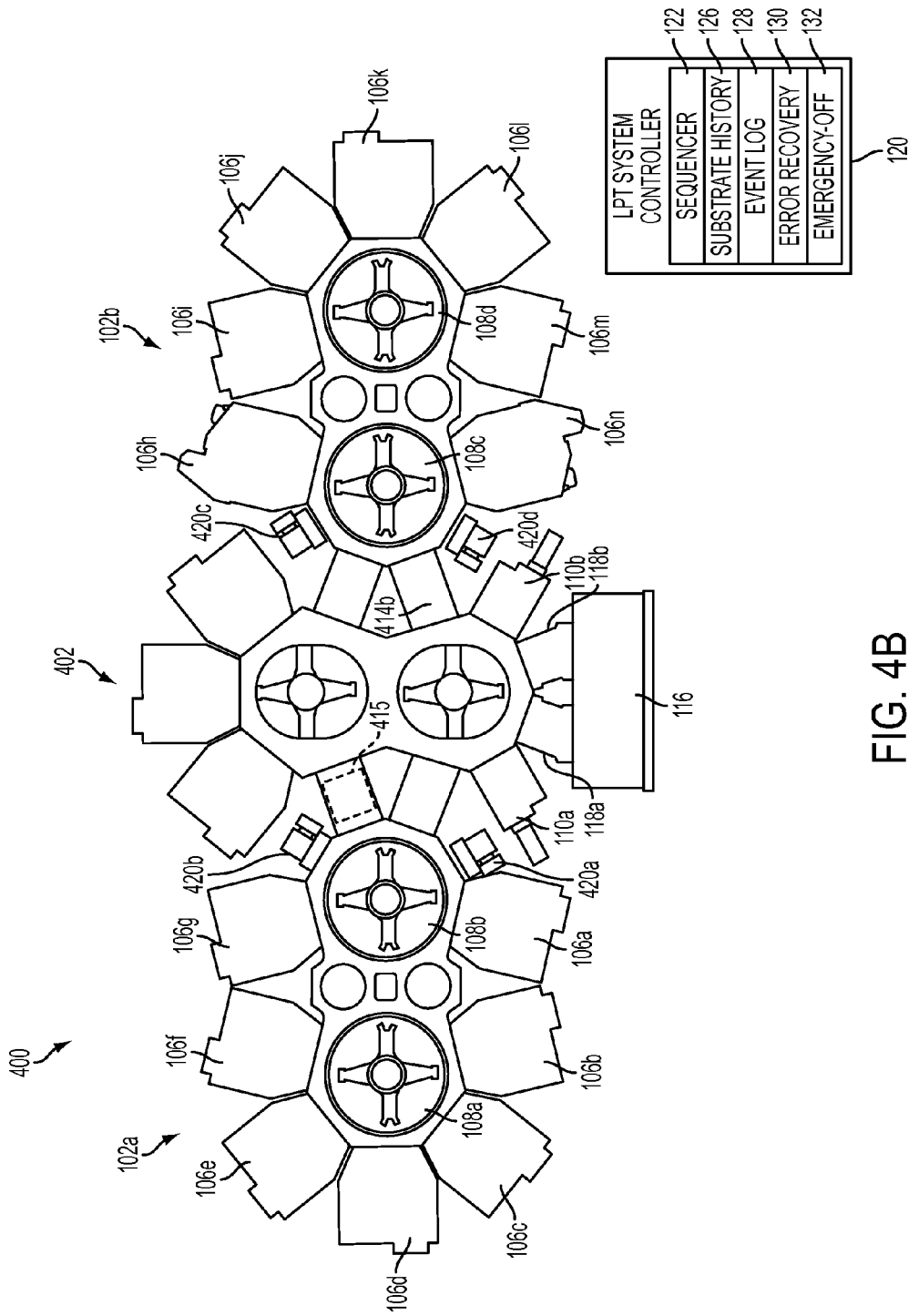
FIG. 4B is a top schematic diagram of another alternative LPT provided in accordance with the present invention.

Additional and/or alternative vacuum pumps, such as cryopumps, turbopumps or the like, may be employed with transfer chambers 108b and/or 108c of processing tool 102a, 102b if desired. For example, FIG. 4B illustrates an embodiment of the LPT 400 in which two pumps 420a, 420b may be added to transfer chamber 108b of processing tool 102a and two pumps 420c, 420d may be added to transfer chamber 108c of processing tool 102b. The pumps 420a-420d may include cryopumps, turbopumps, a combination thereof and/or any other suitable pumps. Other numbers of pumps may be used.

In operation and with reference to FIGS. 4A-4B, substrates are delivered to the LPT 400 at the factory interface 116. For example, a substrate carrier housing a plurality of substrates may be delivered to the factory interface 116. At the factory interface 116, the substrate carrier is opened and substrates are transferred into the LPT 400 for processing. As an example, a substrate may be transferred from the factory interface 116 into first load lock 118a coupled to transfer chamber 408a. Within transfer chamber 408a, the substrate may be degassed and/or precleaned employing one or both of degas/preclean chambers 110a, 110b. Following degas/preclean, the substrate may be transferred through via 414a to transfer chamber 108b of processing tool 102a, for processing within processing chamber 106a, for example. Following processing within processing chamber 106a, the substrate may be transferred to transfer chamber 108a and processed within one or more of processing chambers 106b-f. The substrate then may be transferred back to transfer chamber 108b, processed in processing chamber 106g (if desired), and transferred to transfer chamber 408b of processing tool 402 through via 414c. In some embodiments, via 414c may include a notch finder, a substrate aligner and/or re-orienter, etc., represented by reference numeral 415, that may determine and/or adjust the alignment/orientation of the substrate as it passes between processing tools 102a and 402. For example, substrates may be pre-aligned within the factory interface 116 prior to entering processing chamber 408a. The alignment may be suitable for processing within the various processing chambers of processing tool 102a, but not suitable for processing within the processing chambers 406a-c due to the orientation/position of the processing chambers. In such cases, substrates may be re-aligned prior to entry into processing tool 402.

Within processing tool 402, the substrate may be processed within one or more of processing chambers 406a-c. The substrate then may be transferred to processing tool 102b through via 414d. In some embodiments, via 414d may include a notch finder, a substrate aligner and/or re-orienter, etc., that may determine and/or adjust the alignment/orientation of the substrate as it passes between processing tools 402 and 102b as previously described.

Within processing tool 102b, the substrate may be similarly processed within one or more of processing chamber 106h-106n, and returned to transfer chamber 408a through via 414b. The substrate then may be transferred back to the factory interface 116 and/or a substrate carrier. Note that substrates may travel through the LPT 400 in other directions and/or paths, and be processed within any number of the processing chambers 106a-n in any order.

In some embodiments, the LPT system 400 may be viewed as a single tool, at least to an operator and/or factory software, and employ single tool controller 120, one sequencer 122, one monitor 124, one substrate history 126, and/or one connection to a factory. In other embodiments, each processing tool within the LPT system 400 may be viewed as a separate tool and/or each tool may employ a separate sequencer, monitor, substrate history and/or connection to a factory.

Figure 5:
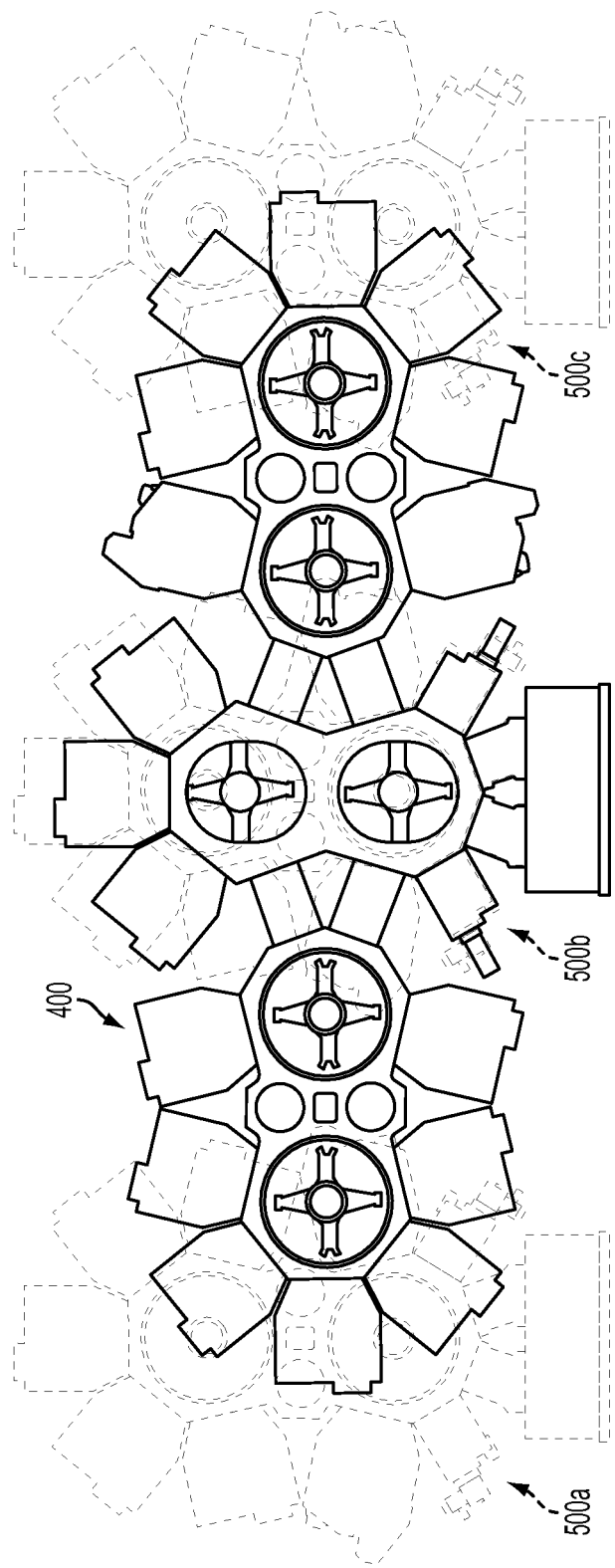
FIG. 5 is a top schematic diagram illustrating the footprint of the LPT of FIG. 4A in comparison to a typical factory layout of three stand-alone processing tools in accordance with embodiments of the present invention.
Figure 6:
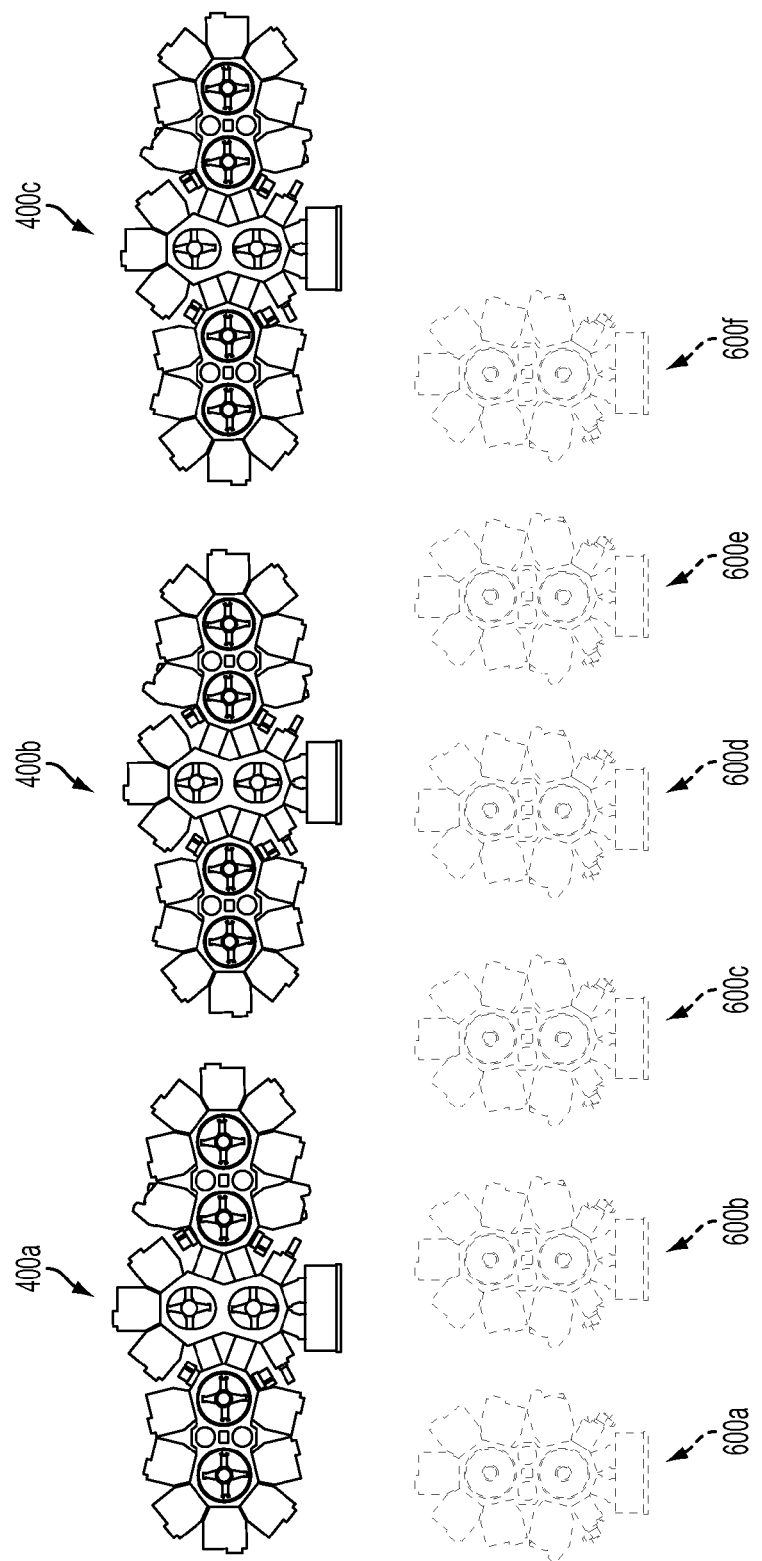
FIG. 6 is a top schematic diagram of an example layout of LPTs of FIG. 4A in comparison to an example layout of stand-alone processing tools in accordance with embodiments of the present invention.

FIG. 5 is a top schematic diagram illustrating the footprint of the LPT 400 of FIG. 4A in comparison to a typical factory layout of three stand-alone processing tools 500a-c. The LPT 400 provides five clean, linked high vacuum transfer chambers (with 17 facets) in comparison to three clean, unlinked high vacuum transfer chambers. FIG. 6 is a top schematic diagram of an example layout of LPTs 400a-c in comparison to an example layout of stand-alone processing tools 600a-f.

Figure 7:
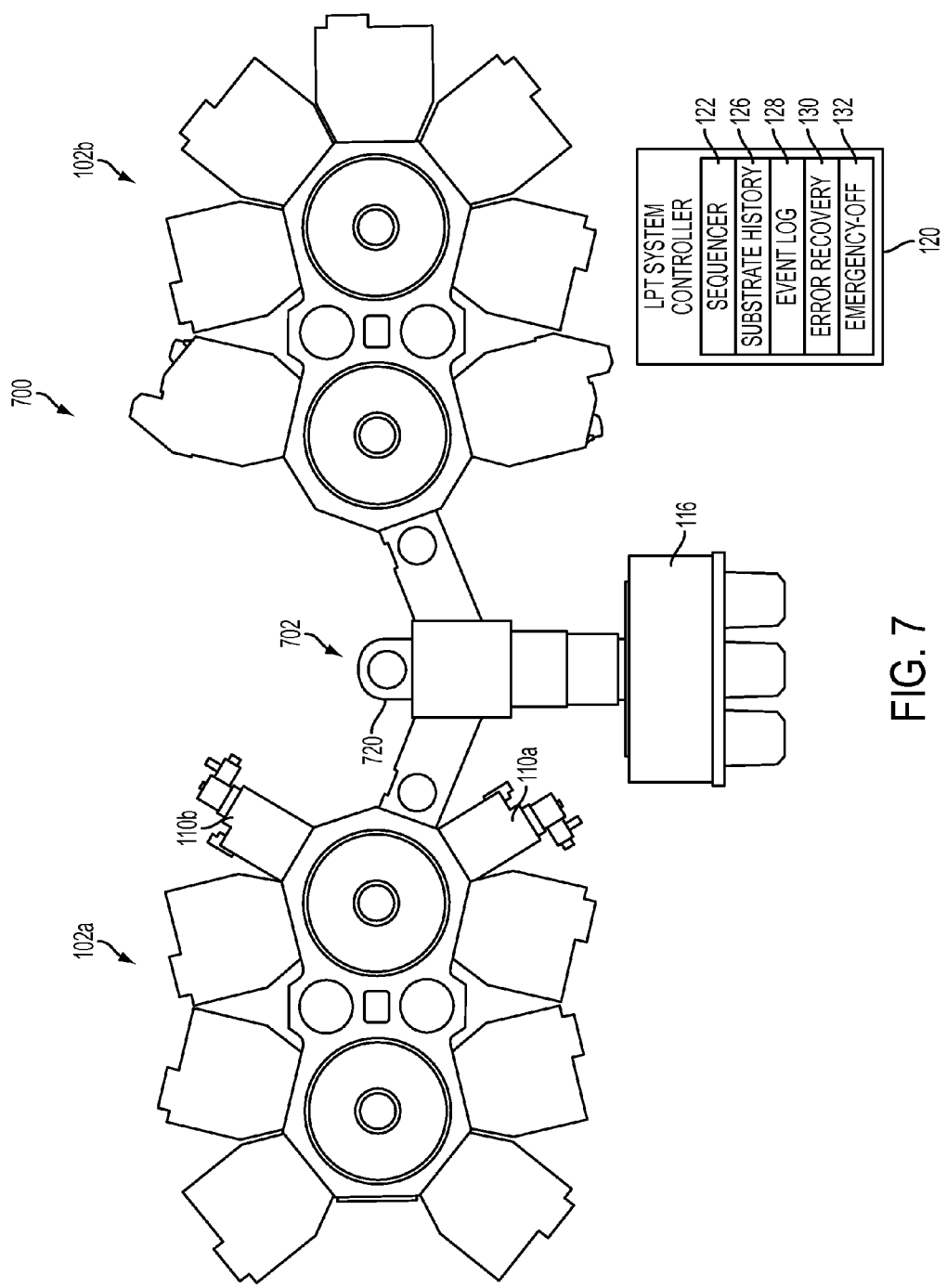
FIG. 7 is a top schematic view of another alternative LPT provided in accordance with embodiments of the present invention.

FIG. 7 is a top schematic view of an alternative LPT 700 provided in accordance with embodiments of the present invention. In the LPT 700 of FIG. 7, the processing tools 102a and 102b are "face-to-face" and a transfer chamber 702 such as the Charger Transfer Chamber available from Applied Materials, Inc. or another suitable transfer chamber is employed to couple processing chambers 102a and 102b, and to supply substrates from a factory interface 116. In such an embodiment, the degas/preclean chambers 110a-110b may be located on the processing tool 102a and/or 102b (shown on processing tool 102a in FIG. 7). In some embodiments, the transfer chamber 702 may include an aligner/orienter 720, for example. Substrates may be pre-aligned within the factory interface 116. The alignment may be suitable for processing within the various processing chambers of processing tool 102a, but not suitable for processing within the various processing chambers of processing tool 102b due to the orientation/position of the processing chambers within processing tool 102b. In such cases, substrates may be re-aligned prior to entry into processing tool 102 b.

Figure 8:
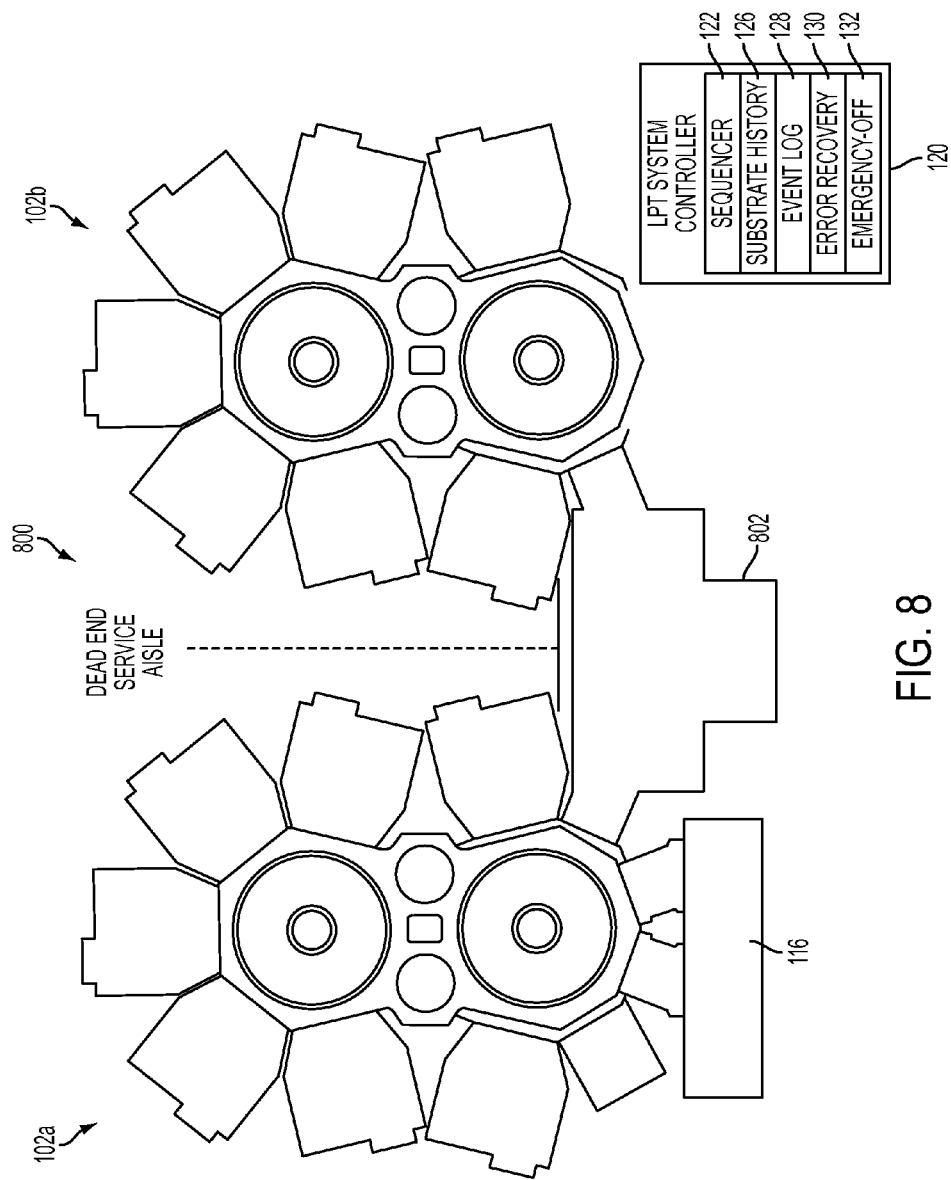
FIG. 8 is a top schematic view of another alternative LPT provided in accordance with embodiments of the present invention.

FIG. 8 is a top schematic view of an alternative LPT 800 provided in accordance with embodiments of the present invention. In the LPT 800 of FIG. 8, the processing tools 102a and 102b are "side-by-side" and a transfer chamber 802 is employed to couple processing chamber 102a and 102b. Substrates may be supplied from a factory interface 116 at one or more of the processing tools 102a and 102b.

Figure 9:
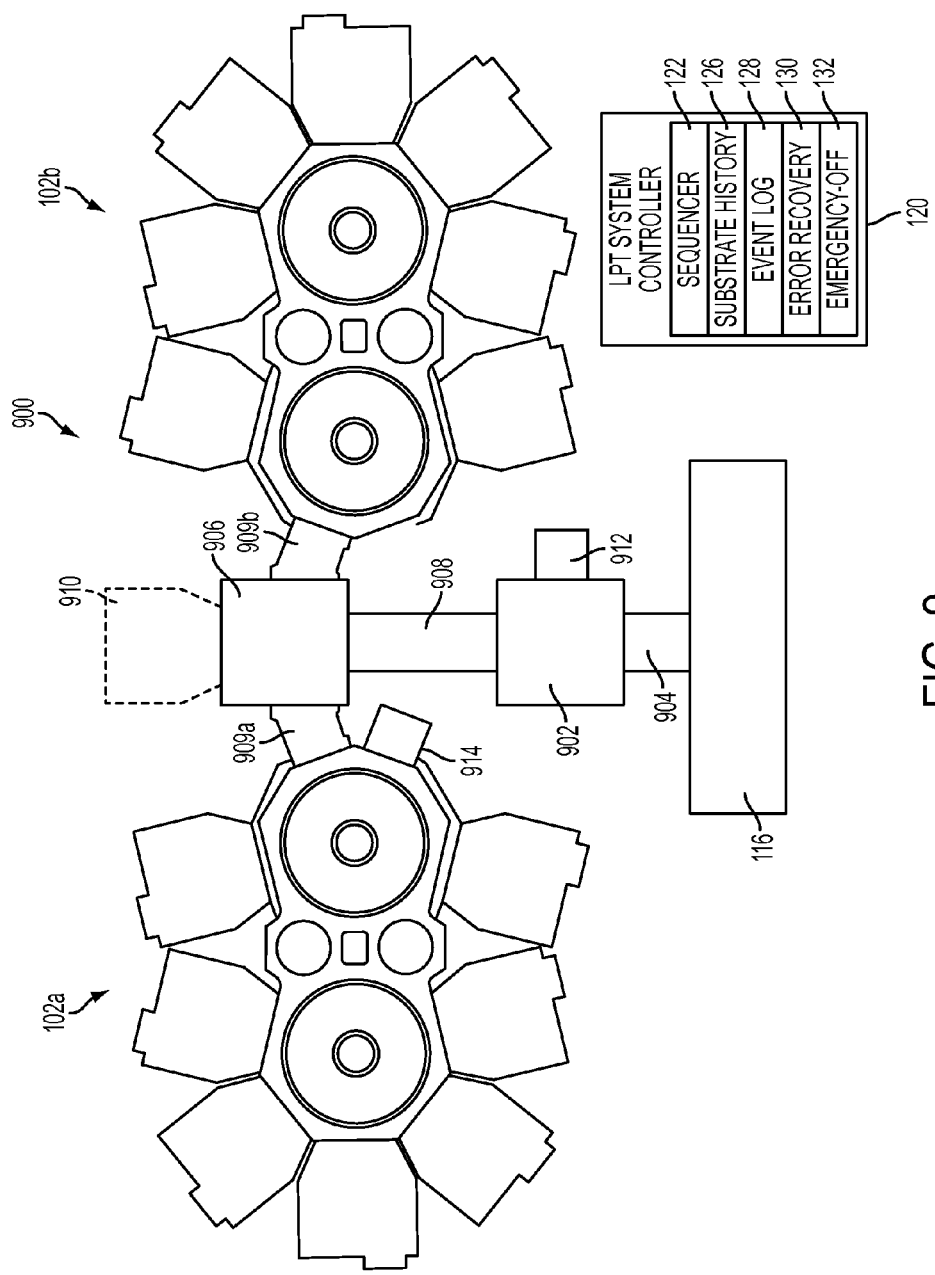
FIG. 9 is a top schematic view of another alternative LPT provided in accordance with embodiments of the present invention.

FIG. 9 is a top schematic view of an alternative LPT 900 provided in accordance with embodiments of the present invention. In the LPT 900 of FIG. 9, the processing tools 102a and 102b are face-to-face. A first transfer chamber 902 couples to factory interface 116 via load lock 904 and supplies substrates to a second transfer chamber 906 through a pass through 908. The transfer chamber 906 is employed to couple processing chamber 102a and 102b through vias 909a and 909b. An additional processing chamber 910 (shown in phantom) may be coupled to transfer chamber 906. In some embodiments, a preclean/degas chamber 912 may be coupled to the transfer chamber 902, for example. Further, in one or more embodiments, an aligner 914 may be in-line with one or more of the vias that couple to the processing chambers 102a and 102b, and/or a standalone aligner may be used, for re-orienting substrates if desired.

Figure 10:
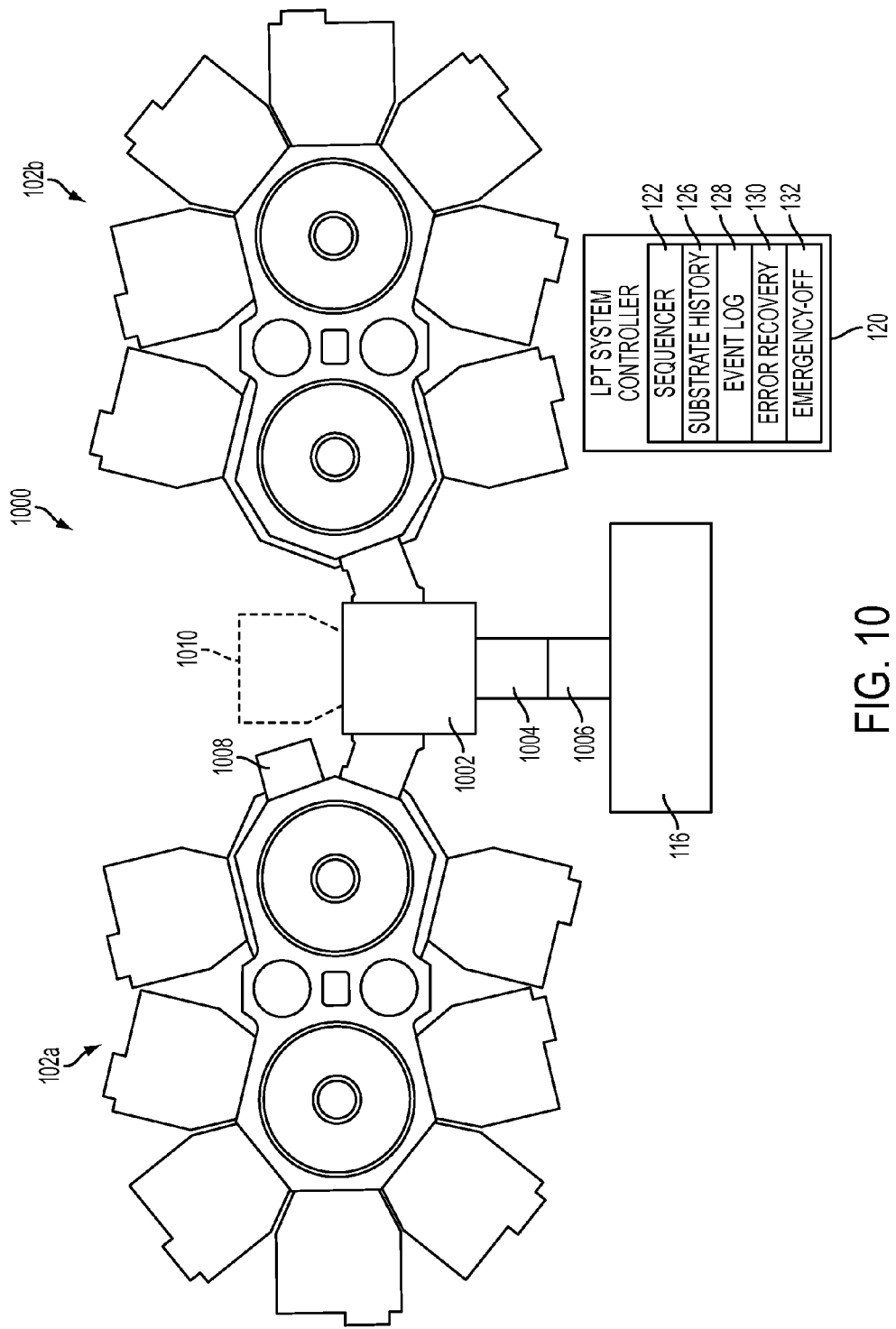
FIG. 10 is a top schematic view of another alternative LPT that is similar to the LPT of FIG. 9, but which includes fewer substrate transfers, in accordance with embodiments of the present invention.

FIG. 10 is a top schematic view of an alternative LPT 1000 that is similar to the LPT 900 of FIG. 9, but which includes fewer substrate transfers. For example, the LPT 1000 includes a transfer chamber 1002 that couples processing chambers 102a, 102b and couples to factory interface through vacuum extension 1004 and load lock 1006. In one or more embodiments, an aligner 1008 may be in-line with one or more of the vias that couple to the processing chambers 102a and 102b, and/or a standalone aligner may be used. An additional processing chamber 1010 (shown in phantom) may be coupled to transfer chamber 1002 in some embodiments.

Figure 11:
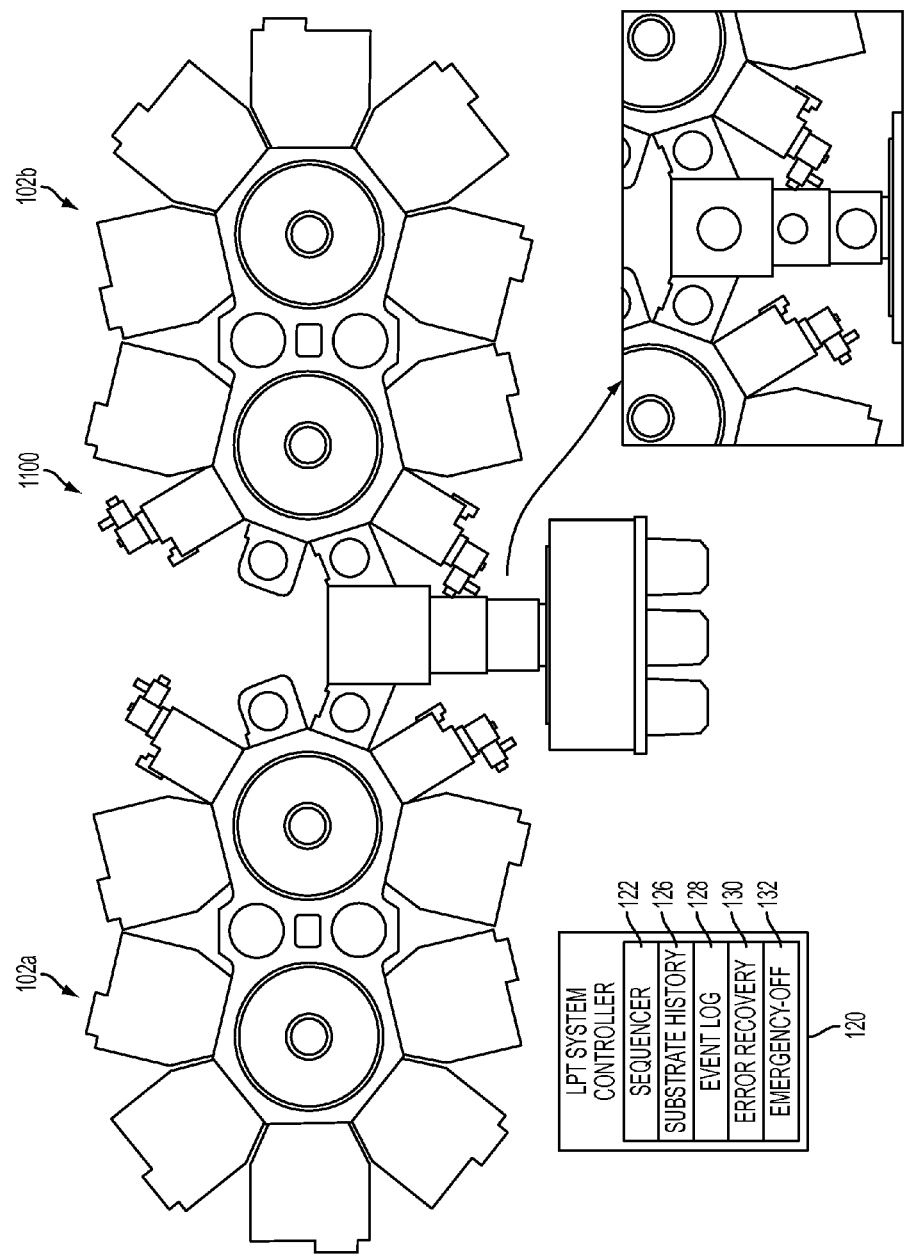
FIG. 11 is a top schematic view of another alternative LPT that is similar to the LPT of FIG. 7, but which includes fewer substrate transfers in accordance with embodiments of the present invention.

FIG. 11 is a top schematic view of an alternative LPT 1100 that is similar to the LPT 700 of FIG. 7, but which includes fewer substrate transfers (e.g., as the transfer chamber is (directly) coupled to the processing tools/vias as shown).

Figure 12:
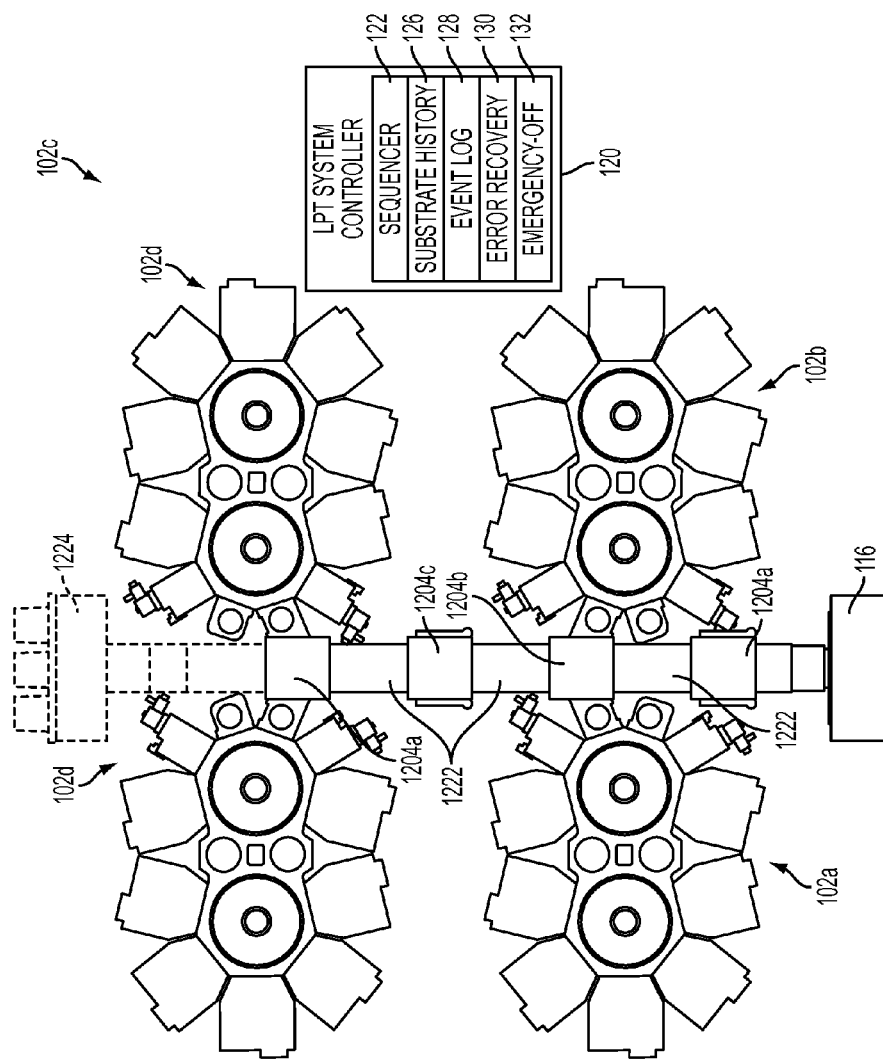
FIG. 12 is a top schematic view of another alternative LPT in which four processing tools are coupled under vacuum with a plurality of transfer chambers and vacuum extensions in accordance with embodiments of the present invention.

FIG. 12 is a top schematic view of an alternative LPT 1200 in which four processing tools 102a-d are coupled under vacuum with a plurality of transfer chambers 1204a-d and vacuum extensions 1222. Additional transfer chamber(s) and/or vacuum extension(s) 1222 may be employed to address service access concerns. In some embodiments, a second factory interface 1224 (shown in phantom) may be positioned on the back end (near processing tools 102c and 102d) of the vacuum link to allow substrates to be removed at the back end location.

Figure 13:
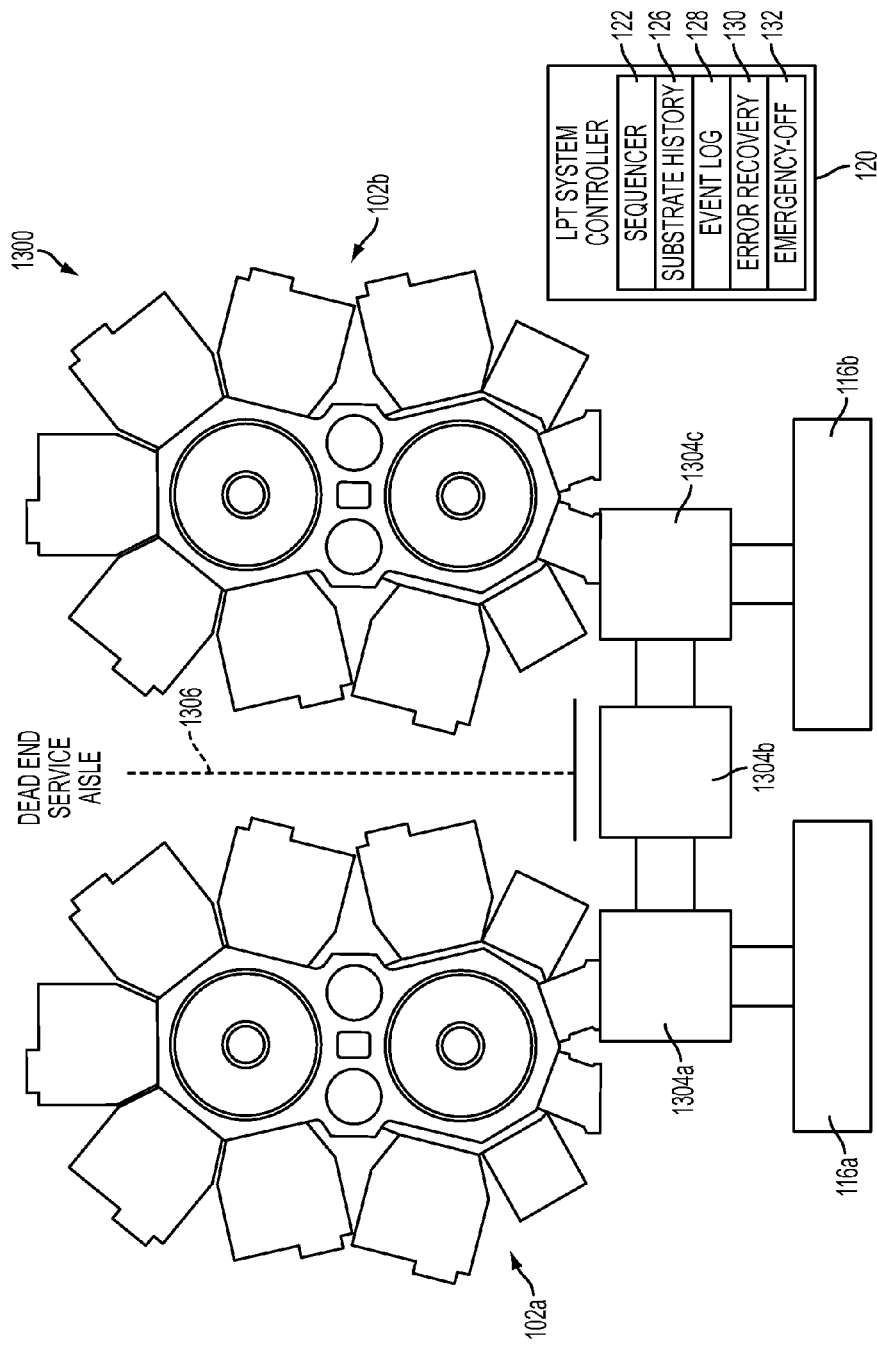
FIG. 13 is a top schematic view of another alternative LPT provided in accordance with embodiments of the present invention.

FIG. 13 is a top schematic view of an alternative LPT 1300 provided in accordance with embodiments of the present invention. In the LPT 1300 of FIG. 13, the processing tools 102a and 102b are side-by-side and multiple transfer chambers 1304a-c are employed to couple processing tools 102a and 102b. Substrates may be supplied from one or more factory interfaces 116a-b. Such an embodiment may provide a convenient service aisle 1306 between the processing tools 102a-102b for servicing the processing chambers coupled to each tool.

Figure 14:
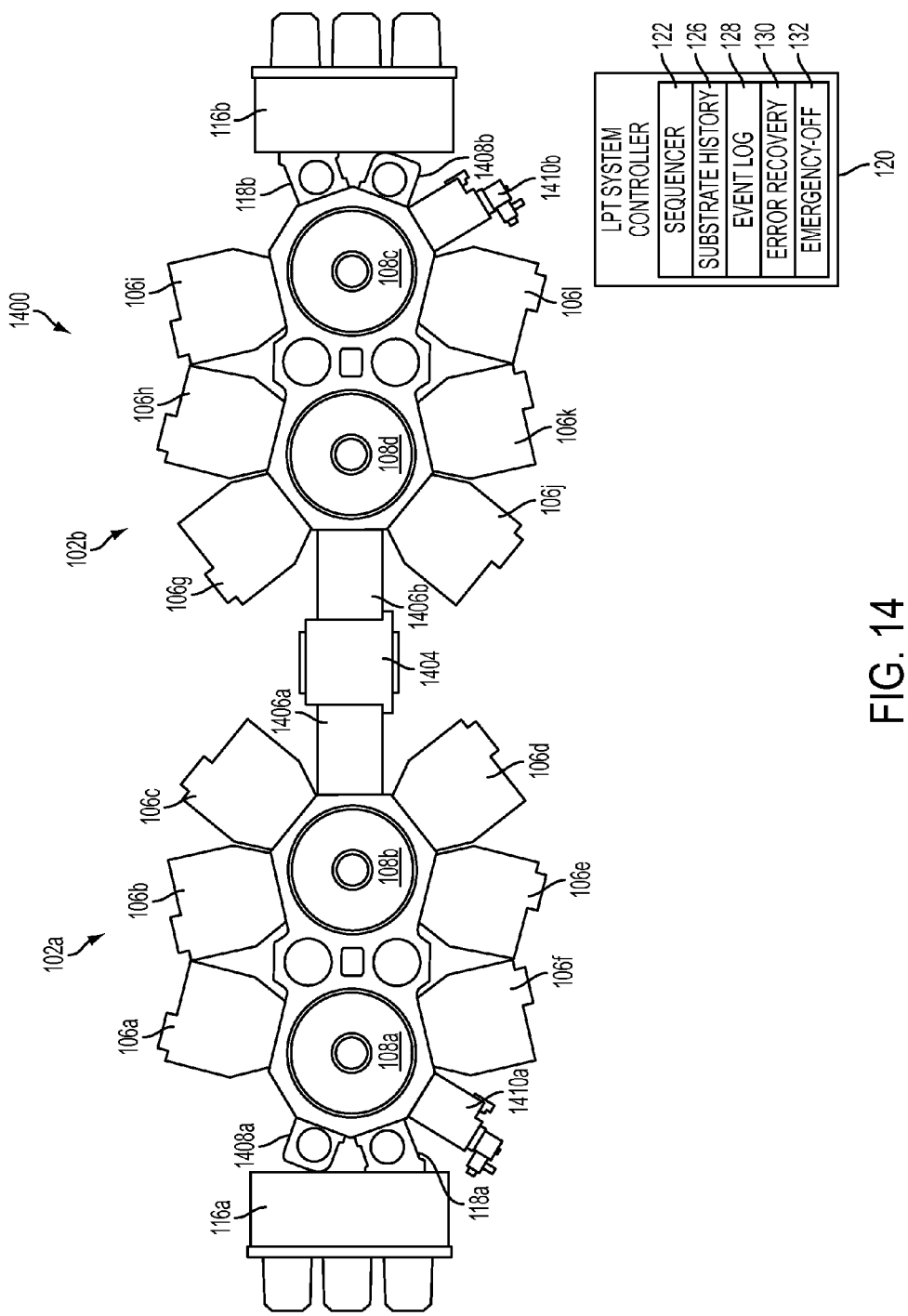
FIG. 14 is a top schematic view of another alternative LPT provided in accordance with embodiments of the present invention.

FIG. 14 is a top schematic view of an alternative LPT 1400 provided in accordance with embodiments of the present invention. In the LPT 1400 of FIG. 14, the processing tools 102a and 102b are face-to-face and are coupled via a transfer chamber 1404 located between the tools 102a, 102b as shown. The transfer chamber 1404 couples to processing chamber 102a through via 1406a and to processing chamber 102b through via 1406b. Substrates are supplied to and/or removed from the LPT 1400 via the processing tool 102a and/or 102b at factory interfaces 116a, 116b. In some embodiments, only one factory interface may be employed (e.g., and substrates may enter and exit the LPT 1400 through the same factory interface 116). One or more of the processing tools 102a and 102b may include an aligner 1408a, 1408b and/or degas chamber 1410a, 1410b.

In operation and with reference to FIG. 14, substrates may be delivered to the LPT 1400 at the factory interface 116a. For example, a substrate carrier housing a plurality of substrates may be delivered to the factory interface 116a. At the factory interface 116a, the substrate carrier is opened and substrates are transferred into the LPT 1400 for processing. As an example, a substrate may be transferred from the factory interface 116a into first load lock 118a coupled to transfer chamber 108a. Within transfer chamber 108a, the substrate may be degassed and/or precleaned employing the degas/preclean chamber 1410a and transferred to processing chamber 106a, for example. Following processing within processing chamber 106a, the substrate may be processed within one or more of processing chambers 106b-f. The substrate then may be transferred to transfer chamber 1404 through via 1406a and then to transfer chamber 108c through via 1406b. In some embodiments, via 1406a and/or 1406b may include a notch finder, a substrate aligner and/or re-orienter, etc., that may determine and/or adjust the alignment/orientation of the substrate as it passes between processing tools 102a and 102b.

Within processing tool 102b, the substrate may be processed within one or more of processing chambers 106g-106j. The substrate then may be transferred to factory interface 116b or back through processing tool 102a to factory interface 116a. Note that substrates may travel through the LPT 1400 in other directions and/or paths, and be processed within any number of the processing chambers 106a-j in any order. In some embodiments, one or more processing chambers may be coupled to transfer chamber 1404 to provide additional processing capabilities to the LPT 1400.

Figure 15:
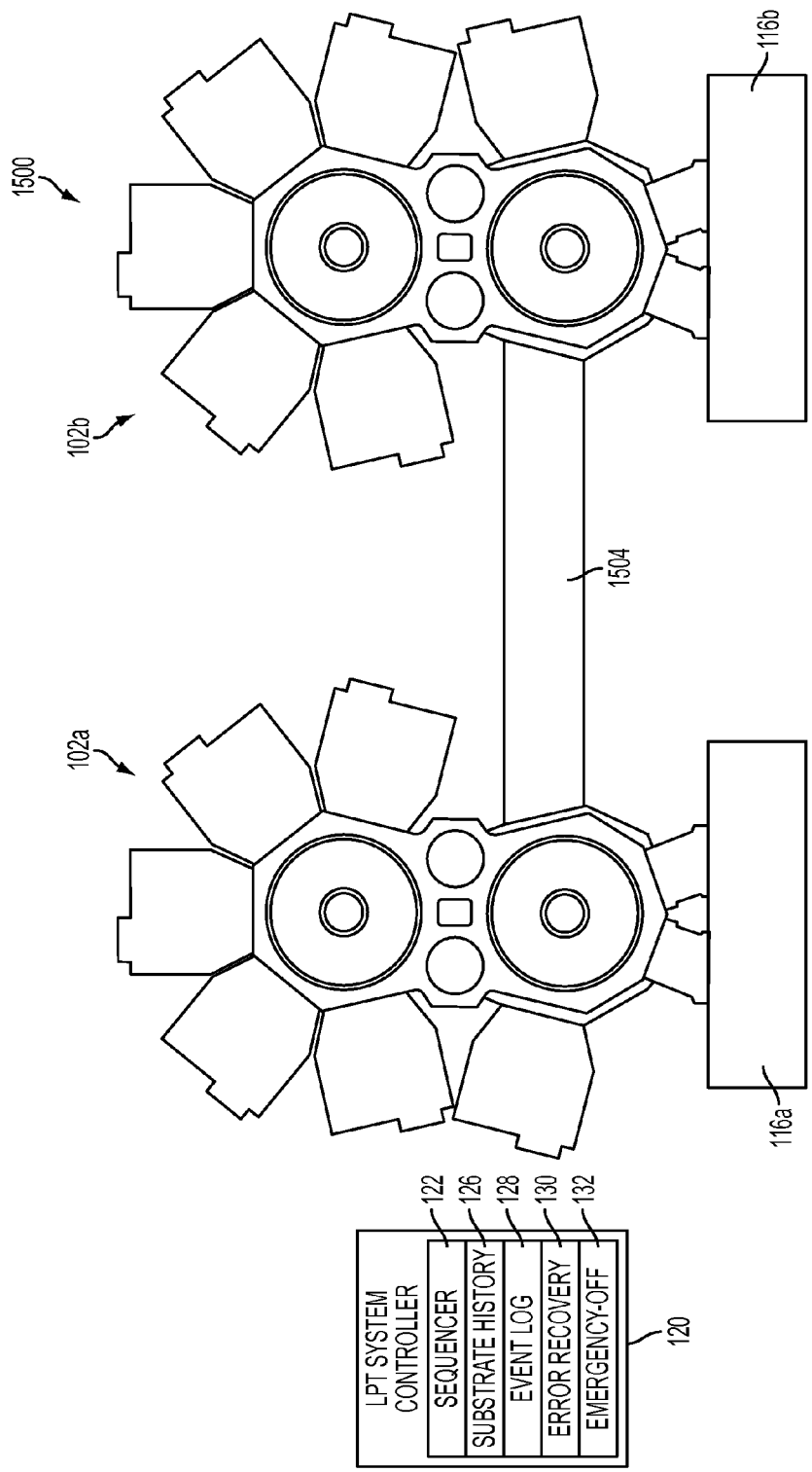
FIG. 15 is a top schematic view of another alternative LPT provided in accordance with embodiments of the present invention.

FIG. 15 is a top schematic view of an alternative LPT 1500 provided in accordance with embodiments of the present invention. In the LPT 1500 of FIG. 15, one of the chamber locations may be employed as a substrate entry/exit location for transfers between processing tools 102a and 102b (through a vacuum extension/tunnel 1504). Substrates may be supplied to processing tools 102a and 102b via factory interface 116a and/or 116b. Such an embodiment has little impact on sequencer design, factory automation, and user interface (e.g., no additional robots and/or substrate locations are employed). In some embodiments, a shuttle mechanism such as one or more robots, a linear rail, or the like may be employed to transfer substrates between the processing tools 102a, 102b.

Figure 16:
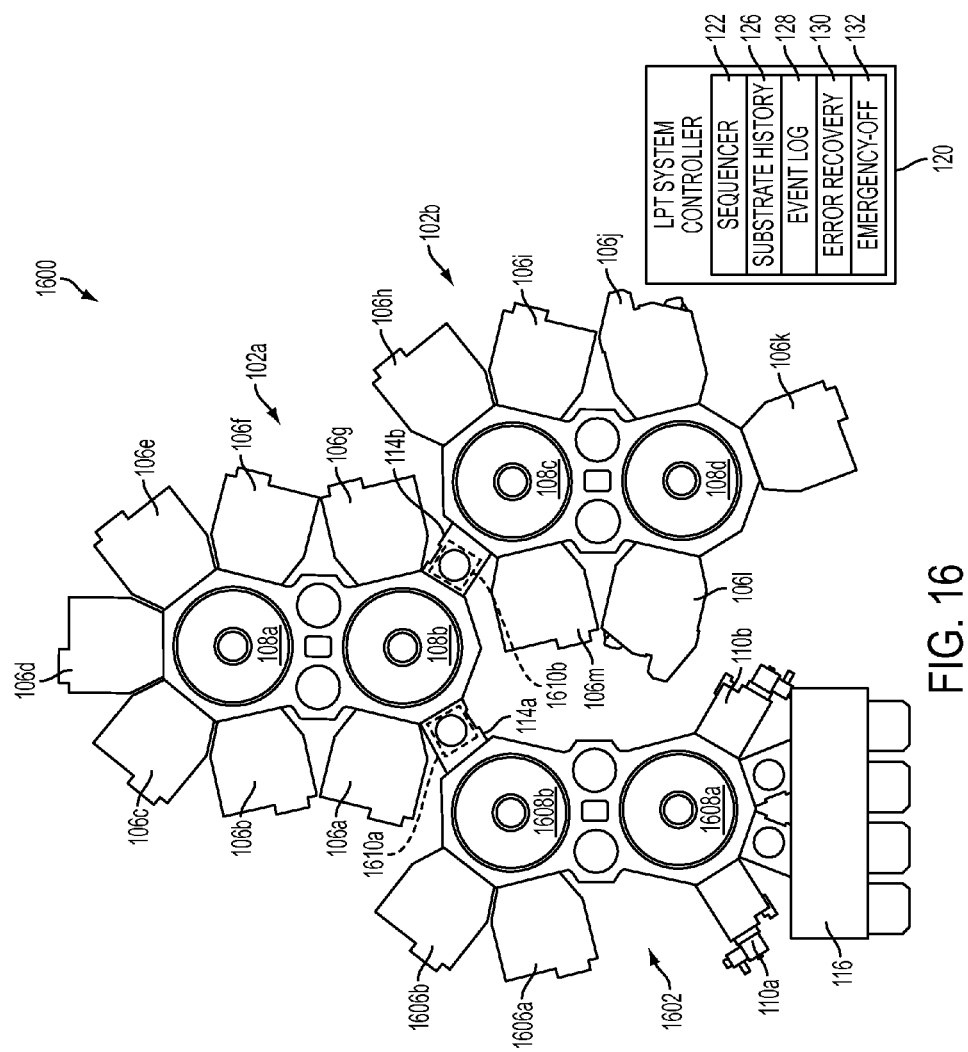
FIG. 16 is a top schematic diagram of another alternative LPT provided in accordance with embodiments of the present invention.

FIG. 16 is a top schematic diagram of an alternative LPT 1600 provided in accordance with embodiments of the present invention. The LPT 1600 employs a dual-transferchamber processing tool 1602 in additional to processing tools 102*a*, 102*b*. For example, the processing tool 1602 may be an Endura 2 system available from Applied Materials, Inc., or another suitable processing tool.

The processing tool 1602 includes processing chambers 1606*a-b*, and first and second transfer chambers 1608*a-b*. The first transfer chamber 1608*a* serves as a buffer chamber for LPT 1600 and provides for substrate transfer to/from second transfer chamber 1608*b*. Second transfer chamber 1608*b* provides for substrate transfer to/from processing tool 102*a* through via 114*a* and transfer chamber 108*b*. Processing tool 102*b* is accessed from transfer chamber 108*b* of processing tool 102*a* through via 114*b*.

Processing tool 102*a* includes processing chambers 106*a-g*. Processing tool 102*b* includes processing chambers 106*h*-106*m*. Processing tool 1602 includes processing chambers 1606*a*-1606*b*. Transfer chamber 1608*b* of processing tool 1602 serves as an additional clean, high vacuum transfer chamber for LPT 1600 and provides additional processing chamber locations as shown. LPT 1600 of FIG. 16 has a total of five clean, linked high vacuum transfer chambers coupling up to eighteen processing chambers in some embodiments (fifteen shown in FIG. 16). A substrate may be transferred from factory interface 116, through transfer (buffer) chamber 1608*a* to transfer chamber 1608*b* to one or more of the processing chambers 1606*a-b* and 106*a-m* for processing. Thereafter, the substrate may be returned to factory interface 116 through transfer (buffer) chamber 1608*a*. In some embodiments, via 114*a* and/or via 114*b* may include a notch finder, a substrate aligner and/or re-orienter, etc., 1610*a*, 1610*b* that may determine and/or adjust the alignment/orientation of a substrate as it passes between processing tools 102*a*, 102*b* and/or 1602.

Additional and/or alternative vacuum pumps, such as cryopumps, turbopumps or the like, may be employed with transfer chambers 108*b* and/or 108*c* of processing tool 102*a*, 102*b* if desired. In some embodiments, transfer chamber 1608*a* may include degas and/or preclean chambers 110*a-b*.

As mentioned, use of an LPT system allows substrates to be transported under vacuum to the various chamber locations of multiple processing tools, and may significantly increase the number of high vacuum or "clean" chamber locations (e.g., facets) available. Further, in some embodiments, the number of degas/preclean chambers may be reduced as substrates remain under vacuum between processing tools. Additionally, in some embodiments, load lock throughput may increase as only pressure equalization is employed, not pump/vent. Through use of an LPT system, a substrate experiences a smaller number of pump/vent cycles per number of chamber visits. In some embodiments, batch load locks may be employed so more substrates may be presented to the processing tool(s) in one pump/vent cycle and/or to potentially decrease the time employed to load and unload the "depth" of the processing tool(s) (e.g., the number of substrates undergoing processing during steady state operation).

LPT systems in accordance with embodiments of the invention may allow use of increased and/or maximum vacuum levels throughout a processing tool. As mentioned, cryopumps, turbopumps or the like, may be used in vacuum tunnels and/or along the face of linked transfer chambers if desired. In some embodiments, such pumps may be used within a single substrate load lock employed within the LPT system; and stacked load locks may be used. Short tunnels and/or linked tool extensions between factory interface(s) and transfer chamber(s) may reduce footprint.

In one or more embodiments of any of the LPT systems described herein, substrate notch may be pre-aligned as a substrate enters the LPT system, such as from a substrate carrier to a load lock. In this manner, a notch may be indexed rather than detected and re-aligned once inside the LPT system and/or processing tool(s).

As described above, in some embodiments, the various LPT systems may provide linked processing tools that allow substrates to be transferred between the processing tools while under vacuum (e.g., a high vacuum level). For example, in one or more embodiments, the various transfer chambers of the LPT systems described herein may be maintained at a vacuum level of about $10^{-6}$ Torr or less or at any other suitable vacuum level. In some embodiments at least four or five transfer chambers of an LPT system may be maintained at a predetermined vacuum level (e.g., a high vacuum level). The vias coupling transfer chambers may also be maintained at a predetermined vacuum level. In some embodiments, supplemental and/or additional pumps may be employed for this purpose, for example.

In some embodiments, the LPT systems may include a sequencer that controls substrate transfer operations between the processing tools and/or other chambers of the LPT system. In other embodiments, multiple sequencers may be employed.

Accordingly, while the present invention has been disclosed in connection with example embodiments thereof, it should be understood that other embodiments may fall within the spirit and scope of the invention, as defined by the following claims.

The invention claimed is:

1. A linked processing tool system comprising:
   a first processing tool having at least a first transfer chamber configured to couple to a plurality of processing chambers;
   a second processing tool having at least a second transfer chamber configured to couple to a plurality of processing chambers;
   a third transfer chamber coupled between the first and second processing tools and configured to transfer substrates between the first and second processing tools;
   a first via coupling the first transfer chamber of the first processing tool directly to the third transfer chamber;
   a second via coupling the second transfer chamber of the second processing tool directly to the third transfer chamber;
   a third via coupling the first transfer chamber of the first processing tool directly to the second transfer chamber of the second processing tool, the via bypassing the third transfer chamber; and
   a single sequencer that controls substrate transfer operations between the first processing tool, the second processing tool and the third transfer chamber of the linked processing tool system.

2. The linked processing tool system of claim 1 wherein the first and second processing tools each include two transfer chambers.

3. The linked processing tool system of claim 1 further comprising a third processing tool wherein the third transfer chamber is a transfer chamber of the third processing tool.

4. The linked processing tool system of claim 1 further comprising at least one of a degas chamber and a pre-clean chamber coupled to the third transfer chamber and wherein the third transfer chamber serves as a buffer chamber between the first and second processing tools.

5. The linked processing tool system of claim 4 wherein the first and second transfer chambers are maintained at a vacuum level of about $10^{-6}$ Torr or less.

6. The linked processing tool system of claim 1 further comprising at least four transfer chambers maintained at a high vacuum level.

7. The linked processing tool system of claim 1 wherein the first, second, and third vias are maintained at a high vacuum level.

8. The linked processing tool system of claim 7 wherein at least one of the vias includes an aligner configured to re-orient a substrate as it travels between the processing tools.

9. The linked processing tool system of claim 1 further comprising a supplemental pump coupled to at least one of the first and second transfer chambers.

10. A linked processing tool system comprising:
a first processing tool having at least a first transfer chamber configured to couple to a plurality of processing chambers;
a second processing tool having at least a second transfer chamber configured to couple to a plurality of processing chambers;
a third transfer chamber that couples to the first and second processing tools in a side-by-side U-shaped configuration;
wherein the first and second processing tools each form a respective parallel side of the U-shaped configuration and have a service aisle there between.

11. The linked processing tool system of claim 10 wherein the first and second processing tools each include two transfer chambers.

12. The linked processing tool system of claim 10 further comprising two additional transfer chambers each coupled to the third transfer chamber and to one of the first and second processing tools.

13. The linked processing tool system of claim 10 further comprising at least one of a degas chamber and a pre-clean chamber coupled to the third transfer chamber.

14. The linked processing tool system of claim 10 further comprising a sequencer that controls substrate transfer operations between the first processing tool, the second processing tool and the third transfer chamber of the linked processing tool system.

15. The linked processing tool system of claim 10 wherein the first and second processing tools and the third transfer chamber are coupled with one or more vias and wherein at least one of the vias includes an aligner configured to re-orient a substrate as it travels between the processing tools.

16. A linked processing tool system comprising:
a first processing tool having a first transfer chamber and a second transfer chamber each configured to couple to a plurality of processing chambers;
a second processing tool having a third transfer chamber and a fourth transfer chamber each configured to couple to a plurality of processing chambers;
a third processing tool having a fifth transfer chamber and a sixth transfer chamber each configured to couple to a plurality of processing chambers;
a first via coupling the second transfer chamber of the first processing tool to the third transfer chamber of the second processing tool;
a second via coupling the second transfer chamber of the first processing tool to the fourth transfer chamber of the second processing tool;
a third via coupling the fifth transfer chamber of the third processing tool to the third transfer chamber of the second processing tool;
a fourth via coupling the fifth transfer chamber of the third processing tool to the fourth transfer chamber of the second processing tool;
wherein the third transfer chamber of the second processing tool serves as a buffer chamber configured to retrieve substrates from a factory interface and transfer the substrates to the second transfer chamber of the first processing tool; and
wherein the first, second and third processing tools are configured so that substrates transferred from the third transfer chamber into the second transfer chamber are isolated from the third transfer chamber and transferred between and processed within processing chambers coupled to the first transfer chamber, second transfer chamber, fourth transfer chamber, fifth transfer chamber and sixth transfer chamber while under vacuum and isolated from the third transfer chamber.

17. The linked processing tool system of claim 16 further comprising at least one of a degas chamber and a pre-clean chamber coupled to the third transfer chamber.

18. The linked processing tool system of claim 16 wherein the first, second, fourth, fifth and sixth transfer chambers are maintained at a high vacuum level.

19. The linked processing tool system of claim 16 wherein at least one of the vias includes an aligner configured to re-orient a substrate as it travels between the processing tools.

20. The linked processing tool system of claim 16 further comprising a sequencer that controls substrate transfer operations between the first, second, third, fourth, fifth, and sixth transfer chambers of the linked processing tool system.

* * * * *